(12) United States Patent
Miyake et al.

(10) Patent No.: US 9,208,742 B2
(45) Date of Patent: Dec. 8, 2015

(54) SEMICONDUCTOR DEVICE, DRIVER CIRCUIT, AND DISPLAY DEVICE

(71) Applicant: Semiconductor Energy Laboratory Co., Ltd., Kanagawa-ken (JP)

(72) Inventors: Hiroyuki Miyake, Kanagawa (JP); Kouhei Toyotaka, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/325,603

(22) Filed: Jul. 8, 2014

(65) Prior Publication Data

US 2015/0015474 A1    Jan. 15, 2015

(30) Foreign Application Priority Data

Jul. 10, 2013    (JP) .................. 2013-144276

(51) Int. Cl.
    *G09G 3/36*    (2006.01)
(52) U.S. Cl.
    CPC ...... *G09G 3/3677* (2013.01); *G09G 2310/0286* (2013.01); *G09G 2310/0291* (2013.01)
(58) Field of Classification Search
    CPC .............. G09G 3/3677; G09G 3/3688; G09G 2310/0286; G09G 2310/0291
    See application file for complete search history.

(56) References Cited

U.S. PATENT DOCUMENTS

| | | | |
|---|---|---|---|
| 7,205,972 B1 * | 4/2007 | Kyeong et al. ................. 345/98 |
| 7,495,648 B2 * | 2/2009 | Kang et al. .................... 345/100 |
| 8,169,396 B2 * | 5/2012 | Chiang et al. ................... 345/99 |
| 8,325,127 B2 * | 12/2012 | Chang et al. ................... 345/100 |
| 9,041,453 B2 * | 5/2015 | Miyake et al. ................ 327/296 |
| 2002/0044111 A1 | 4/2002 | Yamazaki et al. |
| 2004/0041765 A1 | 3/2004 | Koyama et al. |
| 2004/0239603 A1 * | 12/2004 | Toriumi et al. ................. 345/89 |
| 2005/0078079 A1 | 4/2005 | Hashimoto |
| 2005/0128170 A1 * | 6/2005 | Kang et al. ...................... 345/87 |
| 2005/0276369 A1 * | 12/2005 | Mutaguchi ..................... 377/64 |
| 2007/0195248 A1 * | 8/2007 | Huh et al. ..................... 349/139 |
| 2008/0165112 A1 * | 7/2008 | Su ................................ 345/100 |
| 2009/0033818 A1 | 2/2009 | Nakajima et al. |
| 2009/0146940 A1 * | 6/2009 | Kang et al. .................... 345/100 |
| 2009/0289878 A1 * | 11/2009 | Chen ............................... 345/87 |
| 2011/0069805 A1 * | 3/2011 | Koyama et al. .................. 377/2 |
| 2011/0316833 A1 * | 12/2011 | Chang et al. .................. 345/211 |
| 2012/0249499 A1 | 10/2012 | Takahashi et al. |
| 2012/0280725 A1 * | 11/2012 | Koyama et al. ................ 327/109 |
| 2013/0328612 A1 * | 12/2013 | Ofuji et al. ................... 327/408 |
| 2014/0241487 A1 * | 8/2014 | Yamazaki et al. ............. 377/54 |
| 2014/0300399 A1 * | 10/2014 | Miyake et al. ................ 327/296 |
| 2015/0015474 A1 * | 1/2015 | Miyake et al. ................ 345/100 |

FOREIGN PATENT DOCUMENTS

JP    2002-049333 A    2/2002

* cited by examiner

*Primary Examiner* — Patrick F Marinelli
(74) *Attorney, Agent, or Firm* — Husch Blackwell LLP

(57) ABSTRACT

To provide a semiconductor device including a narrowed bezel obtained by designing a gate driver circuit. A gate driver of a display device includes a shift register unit, a demultiplexer circuit, and n signal lines. By connecting the n signal lines for transmitting clock signals to one stage of the shift register unit, (n−3) output signals can be output. The larger n becomes, the smaller the rate of signal lines for transmitting clock signals which do not contribute to output becomes; accordingly, the area of the shift register unit part is small compared to a conventional structure in which one stage of a shift register unit outputs one output signal. Therefore, the gate driver circuit can have a narrow bezel.

8 Claims, 19 Drawing Sheets

SEMICONDUCTOR DEVICE, DRIVER CIRCUIT, AND DISPLAY DEVICE

BACKGROUND OF THE INVENTION

1. Field of the Invention

The present invention relates to an object, a method, or a manufacturing method. The present invention relates to a process, a machine, or manufacture. The present invention particularly relates to, for example, a semiconductor device, a display device, a light-emitting device, a power storage device, a driving method thereof, or a manufacturing method thereof. In particular, the present invention relates to, for example, a semiconductor device including a transistor and a method for manufacturing the semiconductor device.

2. Description of the Related Art

As a means of downsizing, weight saving, and obtaining a narrowed bezel of a flat panel display typified by a liquid crystal display device and a light-emitting display device, it is known that a gate driver and a pixel portion are formed on one substrate. To obtain a bezel which is further narrowed, downsizing of the gate driver is required. Main circuits of the gate driver include a shift register.

REFERENCE

Patent Document

[Patent Document 1] Japanese Published Patent Application No. 2002-49333

SUMMARY OF THE INVENTION

A reduction in width of a shift register which is a main circuit of a gate driver is an effective means of obtaining a narrowed bezel because the reduction in width of the shift register leads to a reduction in width of the whole of a gate driver circuit.

One object of one embodiment of the present invention is to provide a gate driver circuit in which the width of a shift register unit part is reduced. Another object of one embodiment of the present invention is to provide a semiconductor device in which the width of a gate driver circuit is reduced without increasing the delay time of a signal of a signal line of the gate driver circuit. Another object of one embodiment of the present invention is to provide a semiconductor device in which a gate driver circuit is designed to achieve a narrowed bezel.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a driver circuit which includes a shift register unit, a demultiplexer circuit electrically connected to the shift register unit, and n signal lines (n is a natural number of four or more). The shift register unit is electrically connected to one or more of the n signal lines. The demultiplexer circuit is electrically connected to one to (n−3) of the n signal lines.

Another embodiment of the present invention is a driver circuit which includes m shift register units (m is a natural number of three or more), m demultiplexer circuits electrically connected to the m shift register units, and n signal lines (n is a natural number of four or more). Each of the m shift register units is electrically connected to one or more of the n signal lines. Each of the m demultiplexer circuits is electrically connected to one to (n−3) of the n signal lines. To one of the m shift register units, one of outputs of a demultiplexer circuit electrically connected to a shift register unit in the previous stage of one of the m shift register units is input. To one of the m shift register units, one of outputs of the demultiplexer circuit electrically connected to the shift register unit in the next stage of the one of the m shift register units is input.

Another embodiment of the present invention is a driver circuit including a shift register unit including a set signal line, a first transistor, a second transistor, a third transistor, a fourth transistor, a fifth transistor, and a sixth transistor; a demultiplexer circuit; and n signal lines (n is a natural number of four or more). In the driver circuit, one of a source and a drain of the first transistor is electrically connected to a high power supply potential line; the other of the source and the drain of the first transistor is electrically connected to one of a source and a drain of the second transistor and the demultiplexer circuit; a gate of the first transistor is electrically connected to the set signal line; the other of the source and the drain of the second transistor is electrically connected to a low power supply potential line; a gate of the second transistor is electrically connected to the demultiplexer circuit, one of a source and a drain of the fourth transistor, one of a source and a drain of the fifth transistor, and one of a source and a drain of the sixth transistor; one of a source and a drain of the third transistor is electrically connected to the high power supply potential line; the other of the source and the drain of the third transistor is electrically connected to the other of the source and the drain of the fourth transistor; a gate of the third transistor is electrically connected to one of the n signal lines; a gate of the fourth transistor is electrically connected to one of the n signal lines; the other of the source and the drain of the fifth transistor is electrically connected to the low power supply potential line; a gate of the fifth transistor is electrically connected to the set signal line; the other of the source and the drain of the sixth transistor is electrically connected to the high power supply potential line; a gate of the sixth transistor is electrically connected to a reset signal line; the demultiplexer circuit includes a buffers (a is a natural number of one or more and (n−3) or less); each of the a buffers is electrically connected to the other of the source and the drain of the first transistor and the gate of the second transistor; the a buffers are electrically connected to the respective n signal lines; and each of the a buffers includes an output terminal.

According to one embodiment of the present invention, a semiconductor device with a narrowed bezel can be formed.

DETAILED DESCRIPTION OF THE INVENTION

Figure 1A:
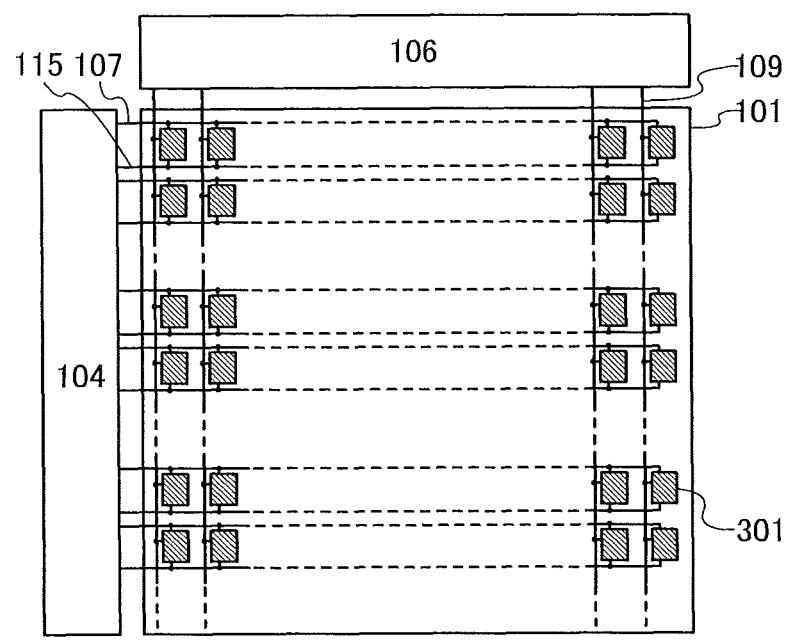
FIGS. 1A and 1B are a block diagram and a circuit diagram illustrating one embodiment of a semiconductor device.

Embodiments of the present invention will be described below in detail with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description in the following embodiments. In addition, in the following embodiments, the same portions or portions having similar functions are denoted by the same reference numerals or the same hatching patterns in different drawings, and description thereof will not be repeated.

Note that in each drawing described in this specification, the size, the film thickness, or the region of each component is exaggerated for clarity in some cases. Therefore, embodiments of the present invention are not limited to such a scale.

In addition, terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flow is changed in circuit operation, for example. Therefore, the terms "source" and "drain" can be replaced with each other in this specification.

Note that a voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is merely called a potential or a voltage, and a potential and a voltage are used as synonymous words in many cases. Thus, in this specification, a potential may be rephrased as a voltage and a voltage may be rephrased as a potential unless otherwise specified.

In this specification, in the case where an etching step is performed after a photolithography step, removal of a mask formed in the photolithography step that is performed after the etching step is not described in some cases for simplicity.

Embodiment 1

In this embodiment, a structure of a semiconductor device that is one embodiment of the present invention and a method for manufacturing the semiconductor device are described with reference to drawings.

FIG. 1A illustrates a liquid crystal display device as one example of a semiconductor device. The liquid crystal display device in FIG. 1A includes a pixel portion 101, a gate driver 104, a source driver 106, m scan lines 107 which are arranged in parallel or substantially in parallel and whose potentials are controlled by the gate driver 104, and n signal lines 109 which are arranged in parallel or substantially in parallel and whose potentials are controlled by the source driver 106. Further, the pixel portion 101 includes a plurality of pixels 301 arranged in a matrix. Capacitor lines 115 which are arranged in parallel or substantially in parallel to the scan lines 107 are also provided. The capacitor lines 115 may be arranged in parallel or substantially in parallel to the signal lines 109. The gate driver 104 and the source driver 106 are collectively referred to as a driver circuit portion in some cases.

Each scan line 107 is electrically connected to the n pixels 301 in the corresponding row among the pixels 301 arranged in m rows and n columns in the pixel portion 101. Each signal line 109 is electrically connected to the m pixels 301 in the corresponding column among the pixels 301 arranged in m rows and n columns. Note that m and n are each an integer of 1 or more. Each capacitor line 115 is electrically connected to the n pixels 301 in the corresponding row among the pixels 301 arranged in m rows and n columns. Note that in the case where the capacitor lines 115 are arranged in parallel or substantially in parallel to the signal lines 109, each capacitor line 115 is electrically connected to the m pixels 301 in the corresponding column among the pixels 301 arranged in m rows and n columns.

Figure 1B:
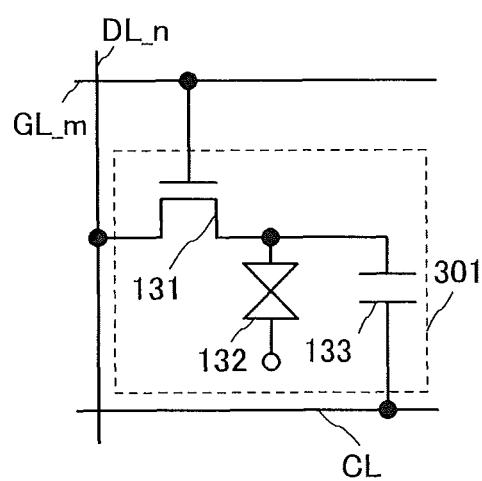

FIG. 1B illustrates a circuit structure that can be used for the pixel 301 in the liquid crystal display device illustrated in FIG. 1A.

The pixel 301 illustrated in FIG. 1B includes a liquid crystal element 132, a transistor 131, and a capacitor 133.

The potential of one of a pair of electrodes of the liquid crystal element 132 is set according to the specifications of the pixels 301 as appropriate. The alignment state of the liquid crystal element 132 depends on written data. A common potential may be applied to one of the pair of electrodes of the liquid crystal element 132 included in each of the plurality of pixels 301. Further, the potential supplied to one of the pair of electrodes of the liquid crystal element 132 in the pixel 301 in one row may be different from the potential supplied to one of the pair of electrodes of the liquid crystal element 132 in the pixel 301 in another row. Alternatively, in the IPS mode or the FFS mode, one of the pair of electrodes of the liquid crystal element 132 can be connected to a capacitor line CL.

As examples of a driving method of the liquid crystal display device including the liquid crystal element 132, any of the following modes can be given: a TN mode, an STN mode, a VA mode, an ASM (axially symmetric aligned micro-cell) mode, an OCB (optically compensated birefringence) mode, an FLC (ferroelectric liquid crystal) mode, an AFLC (antiferroelectric liquid crystal) mode, an MVA mode, a PVA (patterned vertical alignment) mode, an IPS mode, an FFS mode, a TBA (transverse bend alignment) mode, and the like. Other examples of the driving method of the liquid crystal display device include an ECB (electrically controlled birefringence) mode, a PDLC (polymer dispersed liquid crystal) mode, a PNLC (polymer network liquid crystal) mode, and a guest-host mode. Note that one embodiment of the present invention is not limited to this, and various liquid crystal elements and driving methods can be used as a liquid crystal element and a driving method thereof.

The liquid crystal element may be formed using a liquid crystal composition including liquid crystal exhibiting a blue phase and a chiral material. The liquid crystal exhibiting a blue phase has a short response time of 1 msec or less and is optically isotropic; therefore, alignment treatment is not necessary and viewing angle dependence is small.

In the pixel 301 in the mth row and the nth column, one of a source electrode and a drain electrode of the transistor 131 is electrically connected to a signal line DL_n, and the other is electrically connected to one of a pair of electrodes of the capacitor 133 and the other of the pair of electrodes of the liquid crystal element 132. A gate electrode of the transistor 131 is electrically connected to a scan line GL_m. The transistor 131 has a function of controlling whether to write a data signal by being turned on or off.

The other of the pair of electrodes of the capacitor 133 is electrically connected to a wiring to which a potential is supplied (hereinafter referred to as capacitor line CL). The potential of the capacitor line CL is set according to the specifications of the pixel 301 as appropriate. The capacitor 133 functions as a storage capacitor for retaining written data. Note that in the IPS mode or the FFS mode, the other of the pair of electrodes of the capacitor 133 can be electrically connected to one of the pair of electrodes of the liquid crystal element 132.

For example, in the liquid crystal display device including the pixel 301 of FIG. 1B, the pixels 301 are sequentially selected row by row by the gate driver 104, whereby the transistors 131 are turned on and a data signal is written.

When the transistors 131 are turned off, the pixels 301 in which the data has been written are brought into a holding state. This operation is sequentially performed row by row; thus, an image is displayed.

Note that in this specification and the like, examples of liquid crystal display devices having liquid crystal elements are a transmissive liquid crystal display device, a transflective liquid crystal display device, a reflective liquid crystal display device, a direct-view liquid crystal display device, and a projection liquid crystal display. An example of the liquid crystal element is an element that controls transmission or non-transmission of light by optical modulation action of liquid crystals. The element can include a pair of electrodes and a liquid crystal layer. The optical modulation action of liquid crystal is controlled by an electric field applied to the liquid crystal (including a horizontal electric field, a vertical electric field and a diagonal electric field). Note that specifically, the following can be used for a liquid crystal element, for example: a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a polymer dispersed liquid crystal (PDLC), a ferroelectric liquid crystal, an anti-ferroelectric liquid crystal, a main-chain liquid crystal, a side-chain high-molecular liquid crystal, a banana-shaped liquid crystal, and the like.

Instead of a liquid crystal display device, one example of a semiconductor device can be a display element, a display device, a light-emitting device, and the like. A display element, a display device which is a device including a display element, a light-emitting element, and a light-emitting device which is a device including a light-emitting element can employ various modes and can include various elements. Examples of a display element, a display device, a light-emitting element, or a light-emitting device include an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), MIRASOL (registered trademark), an interferometric modulator display (IMOD), a piezoelectric ceramic display, or a carbon nanotube, which are display media whose contrast, luminance, reflectivity, transmittance, or the like is changed by electromagnetic action. Examples of display devices having electron emitters include a field emission display (FED) and an SED-type flat panel display (SED: surface-conduction electron-emitter display). Display devices having electronic ink or electrophoretic elements include electronic paper and the like.

Figure 2:
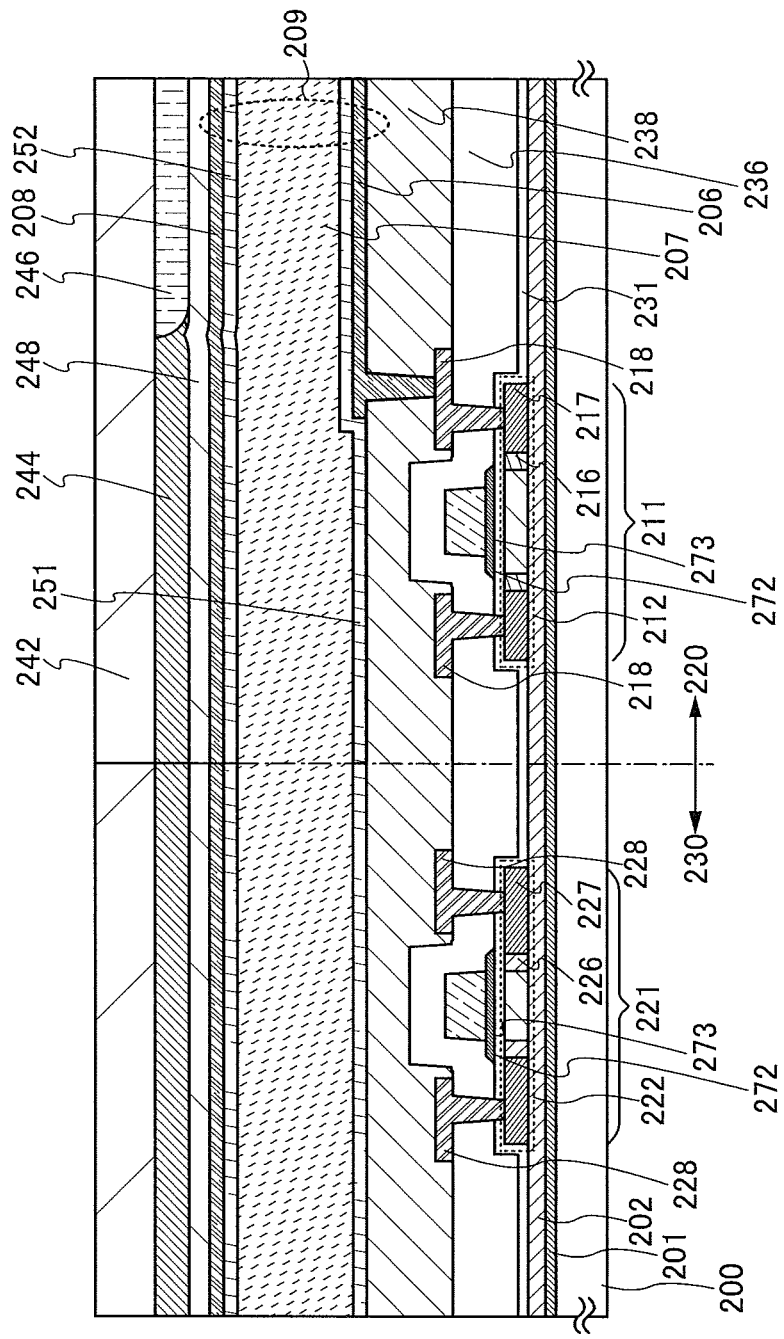
FIG. 2 is a cross-sectional view illustrating one embodiment of a semiconductor device.

Next, a specific example of a liquid crystal display device including a liquid crystal element in the pixel 301 is described. FIG. 2 is a cross-sectional view for illustrating a cross-sectional structure of the liquid crystal display device. FIG. 2 illustrates cross-sectional structures of a gate driver and a pixel circuit. In this embodiment, as a semiconductor device, a liquid crystal display device of a vertical electric field mode is described.

In the liquid crystal display device described in this embodiment, a liquid crystal element 209 is provided between a pair of substrates (a substrate 200 and a substrate 242).

The liquid crystal element 209 includes a conductive layer 206 over the substrate 200, films controlling alignment (hereinafter referred to as alignment films 251 and 252), a liquid crystal layer 207, and a conductive layer 208. The conductive layer 206 functions as one electrode of the liquid crystal element 209, and the conductive layer 208 functions as the other electrode of the liquid crystal element 209.

Thus, "liquid crystal display device" refers to a device including a liquid crystal element. The liquid crystal display device includes a driver circuit for driving a plurality of pixels, for example. The liquid crystal display device may also be referred to as a liquid crystal module including a control circuit, a power supply circuit, a signal generation circuit, a backlight module, and the like provided over another substrate.

The liquid crystal display device shown in FIG. 2 is provided with a transistor 211 included in a pixel portion 220 and a transistor 221 included in a driver circuit portion 230 over the substrate 200. Furthermore, the liquid crystal element 209 including the conductive layer 206, the liquid crystal layer 207, and the conductive layer 208 is included in the pixel portion 220.

In the liquid crystal display device shown in FIG. 2, the transistor 211 provided in the pixel portion 220 includes a semiconductor layer 212 in which a channel region is formed, and the transistor 221 provided in the driver circuit portion 230 includes a semiconductor layer 222 in which a channel region is formed.

Here, components of the display device shown in FIG. 2 are described below.

An insulating film 201 and an insulating film 202 are formed over the substrate 200. The semiconductor layer 212 and the semiconductor layer 222 in which channel regions of the transistors are formed are formed in island-like shapes over the insulating film 202.

There is no particular limitation on the property of a material and the like of the substrate 200 as long as the material has heat resistance enough to withstand at least heat treatment to be performed later. For example, a glass substrate, a ceramic substrate, a quartz substrate, a sapphire substrate, or the like may be used as the substrate 200. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 200. Furthermore, any of these substrates further provided with a semiconductor element may be used as the substrate 200. In the case where a glass substrate is used as the substrate 200, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized liquid crystal display device can be manufactured.

Alternatively, a flexible substrate may be used as the substrate 200, and the transistor may be provided directly on the flexible substrate. Further alternatively, a separation layer may be provided between the substrate 200 and the transistor. The separation layer can be used when part or the whole of an element portion formed over the separation layer is completed and separated from the substrate 200 and transferred to another substrate. In such a case, the transistor can be transferred to a substrate having low heat resistance or a flexible substrate as well.

Each of the insulating film 201 and the insulating film 202 can have a single layer structure or a stacked-layer structure including an insulating film formed of silicon oxide, silicon oxynitride, silicon nitride, or the like by a chemical vapor deposition (CVD) method, a sputtering method, a thermal oxidation method, or the like. As a combination of the insulating film 201 and the insulating film 202, a combination of silicon oxynitride and silicon oxide can be used for example.

The semiconductor layer 212 and the semiconductor layer 222 are preferably formed using crystalline silicon, but may be formed using amorphous silicon. Crystalline silicon is formed in such a manner that, after an amorphous silicon film is formed, the amorphous silicon film is crystallized by laser irradiation. Alternatively, after a metal film such as a Ni film is formed over an amorphous silicon film, the amorphous silicon film may be thermally crystallized. Further alternatively, a crystalline silicon film may be formed by a CVD method.

An insulating film 231 is a gate insulating film. The insulating film 231 can be formed with a single layer structure or a stacked-layer structure using an insulating film of silicon oxide, silicon oxynitride, silicon nitride, or the like by a CVD method, a sputtering method, or the like.

Further, when a silicon oxide film is formed by a CVD method using an organosilane gas as the insulating film 231, the crystallinity of a semiconductor film to be formed later can be increased, whereby the on-state current and the field-effect mobility of the transistor can be increased. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

Alternatively, the insulating film 231 may be formed by performing plasma treatment on the semiconductor layers 212 and 222 to oxidize or nitride the surfaces of the semiconductor layers 212 and 222. For example, the insulating film 231 is formed by plasma treatment with a mixed gas of a rare gas such as He, Ar, Kr or Xe, and oxygen, nitrogen oxide ($NO_2$), ammonia, nitrogen, hydrogen, or the like. In this case, when excitation of plasma is performed by introducing a microwave, plasma with a low electron temperature and high density can be generated. The surface of a semiconductor film can be oxidized or nitrided by oxygen radicals (OH radicals are included in some cases) or nitrogen radicals (NH radicals are included in some cases) generated by this high-density plasma.

By treatment using such high-density plasma, an insulating film with a thickness of 1 nm to 20 nm inclusive, typically 5 nm to 10 nm inclusive, is formed over the semiconductor film. Since reaction in this case is solid-phase reaction, interface state density between the insulating film and the semiconductor film can be made quite low. By such high density plasma treatment, since the semiconductor film is directly oxidized (or nitrided), variation in thickness of the formed insulating film can be made extremely small. By solid-phase oxidation of the surface of the semiconductor film through such high-density plasma treatment, an insulating film which has favorable uniformity and low interface state density can be formed.

As for the insulating film 231, only the insulating film formed by high density plasma treatment may be used, or one or more of insulating films of silicon oxide, silicon oxynitride, or silicon nitride may be deposited and stacked by a CVD method, a sputtering method, or the like. In any case, when transistors include an insulating film formed by high-density plasma in a part or the whole of a gate insulating film, variations in characteristics can be reduced.

Next, a first conductive layer 272 and a second conductive layer 273 are formed over the insulating film 231. The first conductive layer 272 and the second conductive layer 273 can be formed using an element selected from among tantalum (Ta), tungsten (W), titanium (Ti), molybdenum (Mo), aluminum (Al), copper (Cu), chromium (Cr), niobium (Nb), and the like, or an alloy material or a compound material containing such an element as a main component (for example, tantalum nitride). Alternatively, they are each formed using a semiconductor material typified by polycrystalline silicon doped with an impurity element such as phosphorus. Note that the first conductive layer 272 and the second conductive layer 273 may be formed of the same conductive material or different conductive materials.

As a combination of the first conductive layer 272 and the second conductive layer 273, a combination of tantalum nitride and tungsten, a combination of tungsten nitride and tungsten, a combination of molybdenum nitride and molybdenum, or the like can be used for example. Here, the first conductive layer is formed to a thickness greater than or equal to 20 nm and less than or equal to 100 nm by a CVD method, a sputtering method, or the like. The second conductive layer is formed to a thickness greater than or equal to 100 nm and less than or equal to 400 nm. Although a stacked-layer structure of two conductive films is used in this embodiment, one layer or a stacked-layer structure of three or more layers may be alternatively used. In the case of a three-layer structure, a stacked-layer structure of a molybdenum layer, an aluminum layer, and a molybdenum layer may be employed.

Impurity regions 216 and impurity regions 217 are formed in the semiconductor layer 212, and impurity regions 226 and impurity regions 227 are formed in the semiconductor layer 222. An impurity element can be introduced by an ion doping method, an ion implantation method, or the like with the use of an n-type impurity element or a p-type impurity element. As the n-type impurity element, phosphorus (P), arsenic (As), or the like can be used. As the p-type impurity element, boron (B), aluminum (Al), gallium (Ga), or the like can be used.

An insulating film 236 is an interlayer insulating film. Conductive layers 218 and conductive layers 228 are source electrodes and drain electrodes.

The insulating film 236 can be formed using an insulating film made of silicon oxide, silicon oxynitride, silicon nitride, or the like by a CVD method, a sputtering method, or the like.

Alternatively, an organic resin such as an acrylic resin, a polyimide resin, a benzocyclobutene-based resin, a siloxane-based resin, a polyamide resin, or an epoxy resin can be used.

Each of the conductive layers 218 and the conductive layers 228 can have a single layer structure or a stacked-layer structure including one element selected from aluminum, tungsten, titanium, tantalum, molybdenum, nickel, and neodymium, or an alloy containing a plurality of any of these elements. For example, a conductive layer that is formed using an alloy that contains a plurality of any of the elements given above can be formed from an aluminum alloy that contains titanium, an aluminum alloy that contains neodymium, or the like can be used. In the case of forming a stacked-layer structure, for example, a structure where an aluminum layer or the above-described aluminum alloy layer is provided between titanium layers can be used. Note that the conductive layers 218 and 228 serve as source electrodes and drain electrodes of the transistors.

An insulating film 238 is an interlayer insulating film. The conductive layer 206 formed over the insulating film 238 is a pixel electrode. The conductive layer 206 serves as an anode or a cathode in a light-emitting device.

The insulating film 238 can be formed using an insulating film made of silicon oxide, silicon oxynitride, silicon nitride, or the like by a CVD method, a sputtering method, or the like. Alternatively, an organic resin such as an acrylic resin, a polyimide resin, a benzocyclobutene-based resin, a siloxane-based resin, a polyamide resin, or an epoxy resin can be used.

As the conductive layer 206, a transparent conductive film composed of a light-transmitting conductive material may be used, and indium oxide containing tungsten oxide, indium zinc oxide containing tungsten oxide, indium oxide containing titanium oxide, indium tin oxide containing titanium oxide, and the like can be used. Needless to say, it is possible to use indium tin oxide, indium zinc oxide, indium tin oxide with silicon oxide added, or the like. As the conductive layer 206, a material that has a high work function, for example, an element selected from nickel (Ni), tungsten (W), chromium (Cr), platinum (Pt), zinc (Zn), tin (Sn), indium (In), or molybdenum (Mo), or an alloy material including any of the metal elements as its main component, for example, titanium nitride, titanium silicon nitride, tungsten silicide, tungsten nitride, tungsten silicide nitride, or niobium nitride may be used to form a single layer film or a film of stacked layers.

Reference numeral 251 denotes an alignment film. The alignment film 251 can be formed using an organic resin such as polyimide. The thickness of the alignment film 251 is greater than or equal to 40 nm and less than or equal to 100 nm, preferably greater than or equal to 50 nm and less than or equal to 90 mm. With such a thickness, the pretilt angle of a liquid crystal material can be made large, which can reduce disclination.

A film having a coloring property (hereinafter referred to as a coloring film 246) is formed on the substrate 242. The coloring film 246 functions as a color filter. Further, a light-blocking film 244 adjacent to the coloring film 246 is formed on the substrate 242. The light-blocking film 244 functions as a black matrix. The coloring film 246 is not necessarily provided in the case where the liquid crystal display device is a monochrome display device, for example.

The coloring film 246 is a coloring film that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used.

The light-blocking film 244 preferably has a function of blocking light in a particular wavelength range, and can be a metal film, an organic insulating film including a black pigment, or the like.

An insulating film 248 is formed on the coloring film 246. The insulating film 248 functions as a planarization film or suppresses diffusion of impurities in the coloring film 246 to the liquid crystal element side.

The conductive layer 208 is formed on the insulating film 248. The conductive layer 208 functions as the other of the pair of electrodes of the liquid crystal element in the pixel portion. Note that the alignment film 251 is formed over the conductive layer 206, and the alignment film 252 is formed on the conductive layer 208.

The liquid crystal layer 207 is formed between the conductive layer 206 and the conductive layer 208. The liquid crystal layer 207 is sealed between the substrate 200 and the substrate 242 with the use of a sealant (not illustrated). The sealant is preferably in contact with an inorganic material to prevent entry of moisture and the like from the outside.

A spacer may be provided between the conductive layer 206 and the conductive layer 208 to maintain the thickness of the liquid crystal layer 207 (also referred to as a cell gap).

Next, a method for manufacturing the transistors 211 and 221 of the liquid crystal display device illustrated in FIG. 1A is described with reference to FIGS. 3A to 3E and FIGS. 4A to 4D.

First, the substrate 200 is prepared. Here, a glass substrate is used as the substrate 200.

Next, the insulating film 201 and the insulating film 202 are sequentially stacked over the substrate 200. Each of the insulating film 201 and the insulating film 202 can have a single layer structure or a stacked-layer structure using an insulating film formed of silicon oxide, silicon oxynitride, silicon nitride, or the like by a CVD method, a sputtering method, a thermal oxidation method, or the like. As a combination of the insulating film 201 and the insulating film 202, a combination of silicon oxynitride and silicon oxide can be used for example.

Figure 3A:
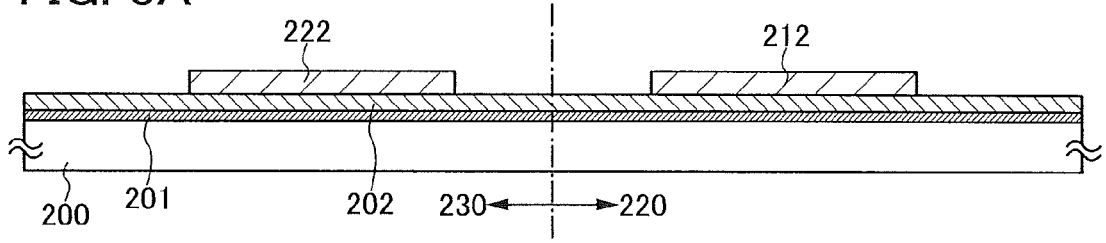
FIGS. 3A to 3E are cross-sectional views illustrating one embodiment of a method for manufacturing a semiconductor device.

Next, the semiconductor film is formed over the insulating film 202 and is selectively etched to form the semiconductor layer 212 and the semiconductor layer 222. The semiconductor layer 212 and the semiconductor layer 222 are preferably formed using crystalline silicon. In this embodiment, after amorphous silicon is formed by a CVD method, the amorphous silicon is crystallized by laser irradiation. Note that heat treatment for removing hydrogen may be performed before the laser irradiation (FIG. 3A).

Figure 3B:
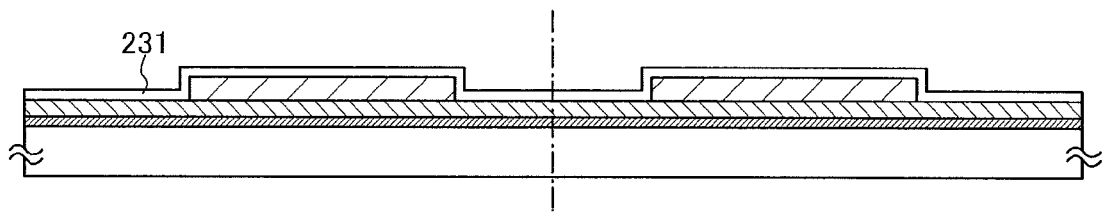

Next, the insulating film 231 is formed to cover the semiconductor layer 212 and the semiconductor layer 222. The insulating film 231 can be formed with a single layer structure or a stacked-layer structure using an insulating film of silicon oxide, silicon oxynitride, silicon nitride, or the like by a CVD method, a sputtering method, a thermal oxidation method, or the like. Here, silicon oxide is used for the gate insulating film (FIG. 3B).

Figure 3C:
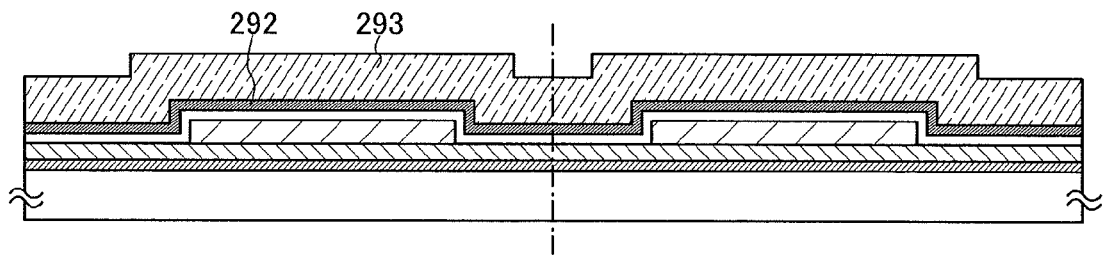

Next, a first conductive film 292 and a second conductive film 293 are sequentially stacked over the insulating film 231. Each of the first conductive film 292 and the second conductive film 293 can be formed using an element selected from among tantalum (Ta), tungsten (W), titanium (Ti), molybdenum (Mo), aluminum (Al), copper (Cu), chromium (Cr), niobium (Nb), and the like, or an alloy material or a compound material containing such an element as a main component (for example, tantalum nitride). Alternatively, they are each formed using a semiconductor material typified by polycrystalline silicon doped with an impurity element such as phosphorus. Note that the first conductive film 292 and the second conductive film 293 may be formed of the same conductive material or different conductive materials. Here, the first conductive film and the second conductive film are formed using a tantalum nitride film and a tungsten film, respectively (FIG. 3C).

Figure 3D:
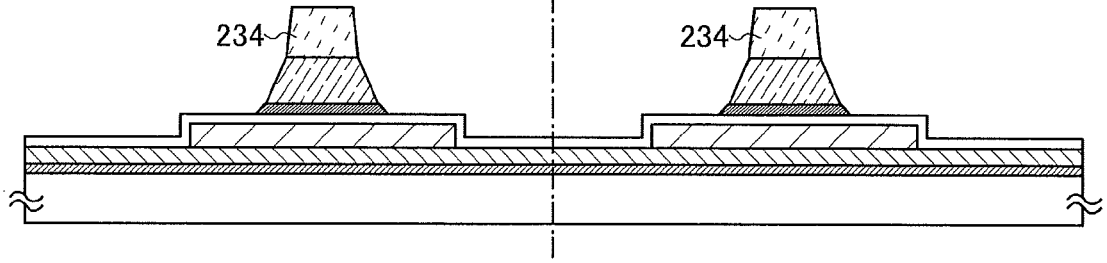

Then, resist masks 234 are selectively formed over the second conductive film 293, and first etching treatment and second etching treatment are performed using the resist masks 234. By performing the first etching treatment, the first conductive film 292 and the second conductive film 293 that are formed over the insulating film 231 are selectively etched. Thus, a stacked-layer structure including a first conductive layer 232a and a second conductive layer 233a that can serve as a gate electrode is made to remain over the semiconductor layer 212, and a stacked-layer structure including a first conductive layer 232b and a second conductive layer 233b that can serve as a gate electrode is made to remain over the semiconductor layer 222 (FIG. 3D).

Figure 3E:
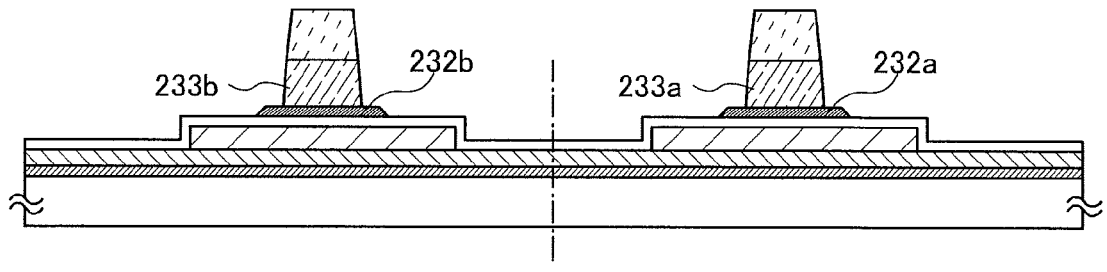

By performing the second etching treatment after that, end portions of the second conductive layer 233a and the second conductive layer 233b are selectively etched, thereby obtaining a structure where the second conductive layer 233a and the second conductive layer 233b each have a smaller width than the first conductive layer 232a and the first conductive layer 232b (FIG. 3E).

An etching method for carrying out the first etching treatment and the second etching treatment may be selected as appropriate. In order to improve the etching rate, a dry etching apparatus using a high density plasma source of ECR (electron cyclotron resonance) or ICP (inductively coupled plasma) or the like may be used. With appropriate control of the etching conditions of the first etching treatment and the second etching treatment, the end portions of the first conductive layers 232a and 232b and the second conductive layers 233a and 233b can be formed into desired tapered shapes.

Figure 4A:
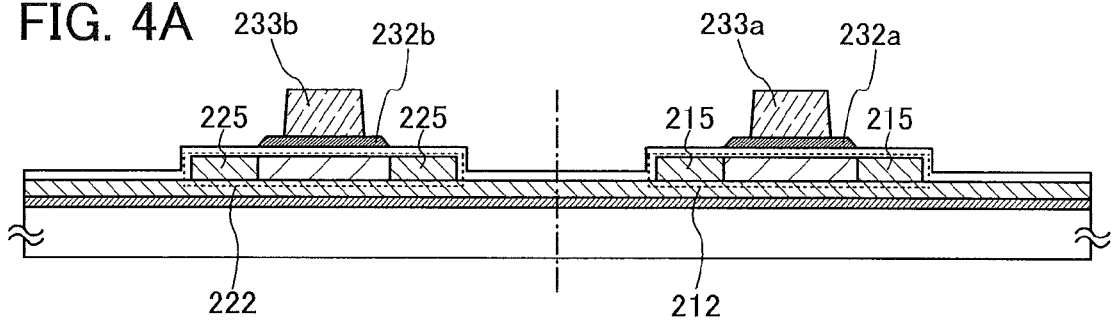
FIGS. 4A to 4D are cross-sectional views illustrating one embodiment of a method for manufacturing a semiconductor device.

Next, an impurity element is introduced into the semiconductor layer 212 and the semiconductor layer 222 using the first conductive layer 232a, the first conductive layer 232b, the second conductive layer 233a, and the second conductive layer 233b as masks to form low-concentration impurity regions 215 in the semiconductor layer 212 and low-concentration impurity regions 225 in the semiconductor layer 222 (FIG. 4A).

An impurity element can be introduced by an ion doping method, an ion implantation method, or the like with the use of an n-type impurity element or a p-type impurity element. As the n-type impurity element, phosphorus (P), arsenic (As), or the like can be used. As the p-type impurity element, boron (B), aluminum (Al), gallium (Ga), or the like can be used.

Here, an example is described in which the impurity regions 215 are formed in regions which do not overlap with the first conductive layer 232a in the semiconductor layer 212; however, the impurity regions 215 can be formed in regions overlapping with the first conductive layer 232a depending on the condition of introducing the impurity element. Further, an example is described in which the impurity regions 225 are formed in regions which do not overlap with the first conductive layer 232b in the semiconductor layer 222; however, the impurity regions 225 can be formed in regions overlapping with the first conductive layer 232b depending on the condition of introducing the impurity element.

Figure 4B:
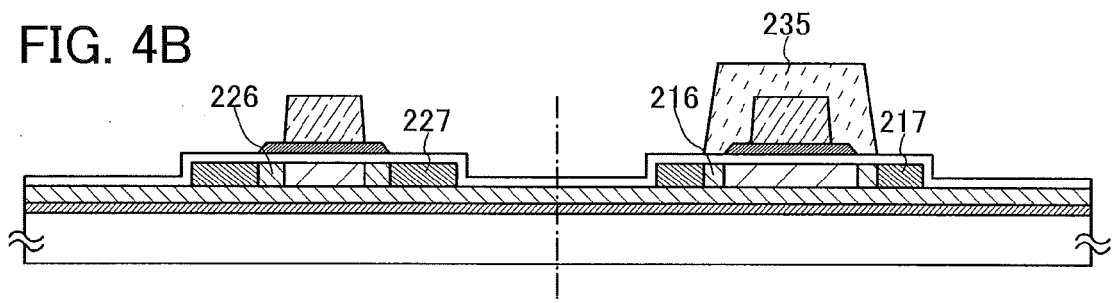

A resist mask 235 is selectively formed over the first conductive layer 232a, the second conductive layer 233a, and the semiconductor layer 212, and an impurity element is introduced into the semiconductor layers 212 and 222 with the use of the resist mask 235, the first conductive layer 232b, and the second conductive layer 233b as masks. As a result, the impurity regions 216 and the impurity regions 217 are formed in the semiconductor layer 212, and the impurity regions 226 and the impurity regions 227 are formed in the semiconductor layer 222. Note that the impurity element goes through the first conductive layer 232b to be introduced into the semiconductor layer 222 (FIG. 4B).

The impurity element can be introduced by an ion doping method, an ion implantation method, or the like. As the n-type impurity element, phosphorus (P), arsenic (As), or the like can be used. As the p-type impurity element, boron (B), aluminum (Al), gallium (Ga), or the like can be used. Here, the impurity regions 216, 217, 226, and 227 are subjected to ion doping using phosphorus (P).

In the semiconductor layer 212, the high-concentration impurity regions 217 formed in regions which are not covered with the resist mask 235 serve as a source region and a drain region of the transistor, and the low-concentration impurity regions 216 formed in regions which are covered with the resist mask 235 and do not overlap with the first conductive layer 232a serve as LDD regions of the transistor. Further, in the semiconductor layer 222, the high-concentration impurity regions 227 formed in regions which do not overlap with the first conductive layer 232b serve as a source region and a drain region of the transistor, and the low-concentration impurity regions 226 formed in regions which overlap with the first conductive layer 232b but do not overlap with the second conductive layer 233b serve as LDD regions of the transistor.

The LDD region is a region to which an impurity element is added at low concentration between a channel forming region and a source region or a drain region which is formed by being doped with an impurity element at high concentration. By providing the LDD region, the effects of reducing the electric field in the vicinity of the drain region and preventing deterioration due to hot carrier injection can be obtained. In order to prevent deterioration of on-state current due to hot carriers, a structure (also referred to as a GOLD (gate-drain overlapped LDD) structure) may be employed in which a LDD region overlaps with a gate electrode with a gate insulating film interposed therebetween. This embodiment shows an example in which a LDD region is used in the n-channel transistor 211 included in the pixel portion and a GOLD structure is used in the n-channel transistor 221 included in the driver circuit portion. However, one embodiment of the present invention is not limited thereto, and a GOLD structure may be used in the transistor included in the pixel portion 220.

Figure 4C:
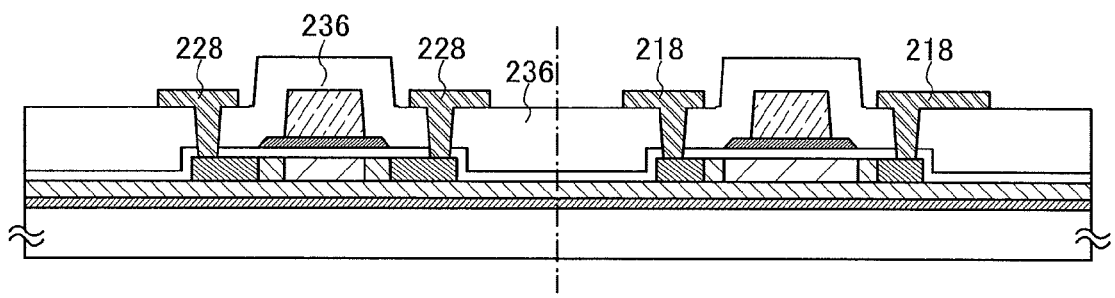

Next, an interlayer insulating film is formed. Here, the insulating film 236 is formed as the interlayer insulating film. Then, opening portions are selectively formed in the insulating film 231 and the insulating film 236, and the conductive layers 218 and the conductive layers 228 that serve as source electrodes and drain electrodes are formed (FIG. 4C).

The insulating film 236 can be formed using an insulating film made of silicon oxide, silicon oxynitride, silicon nitride, or the like by a CVD method, a sputtering method, or the like. Alternatively, an organic resin such as an acrylic resin, a polyimide resin, a benzocyclobutene-based resin, a siloxane-based resin, a polyamide resin, or an epoxy resin can be used. Here, the insulating film 236 is formed using silicon oxide, silicon oxynitride, or silicon nitride by a CVD method.

The conductive layers 218 and the conductive layers 228 can be formed with a single layer structure or a stacked-layer structure using one element selected from aluminum, tungsten, titanium, tantalum, molybdenum, nickel, and neodymium, or an alloy containing a plurality of any of these elements. For example, a conductive layer that is formed using an alloy that contains a plurality of any of the elements given above can be formed from an aluminum alloy that contains titanium, an aluminum alloy that contains neodymium, or the like can be used. In the case of forming a stacked-layer structure, for example, a structure where an aluminum layer or the above-described aluminum alloy layer is provided between titanium layers can be used. Note that the conductive layers 218 and 228 serve as the source electrodes and the drain electrodes of the transistors.

Figure 4D:
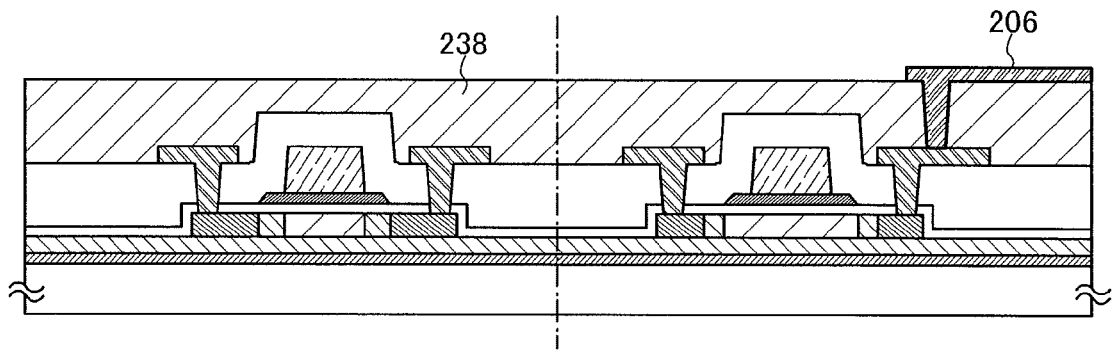

Next, the insulating film 238 is formed. Then, an opening portion is provided in the insulating film 238, and the conductive layer 206 serving as a pixel electrode is formed so as to be electrically connected to the conductive layer 218. The conductive layer 206 serves as an anode or a cathode in a light-emitting device (FIG. 4D).

The insulating film 238 can be formed using an insulating film made of silicon oxide, silicon oxynitride, silicon nitride, or the like by a CVD method, a sputtering method, or the like. Alternatively, an organic resin such as an acrylic resin, a polyimide resin, a benzocyclobutene-based resin, a siloxane-based resin, a polyamide resin, or an epoxy resin can be used.

A transparent conductive film formed using a light-transmitting conductive material may be used for the conductive layer 206 which serves as a pixel electrode, and indium oxide containing tungsten oxide, indium zinc oxide containing tungsten oxide, indium oxide containing titanium oxide, indium tin oxide containing titanium oxide, or the like can be used. Needless to say, it is possible to use indium tin oxide, indium zinc oxide, indium tin oxide with silicon oxide added, or the like. Furthermore, a material that has a high work function, for example, an element selected from nickel (Ni), tungsten (W), chromium (Cr), platinum (Pt), zinc (Zn), tin (Sn), indium (In), or molybdenum (Mo), or an alloy material including any of the metal elements as its main component, for example, titanium nitride, titanium silicon nitride, tungsten silicide, tungsten nitride, tungsten silicide nitride, or niobium nitride may be used to form a single layer film or a film of stacked layers.

Thus, the transistor 211 and the transistor 221 of the liquid crystal display device illustrated in FIG. 1A can be manufactured.

Note that the structure and the like described in this embodiment can be used as appropriate in combination with any of the structures and the like in the other embodiments.

Modification Example

A modification example of the gate electrode in Embodiment 1 is described with reference to FIG. 5.

In FIG. 2, the gate electrode has a two-layer structure including the conductive films. In FIG. 5, the gate electrode has a single-layer structure including a conductive film 261.

Figure 5:
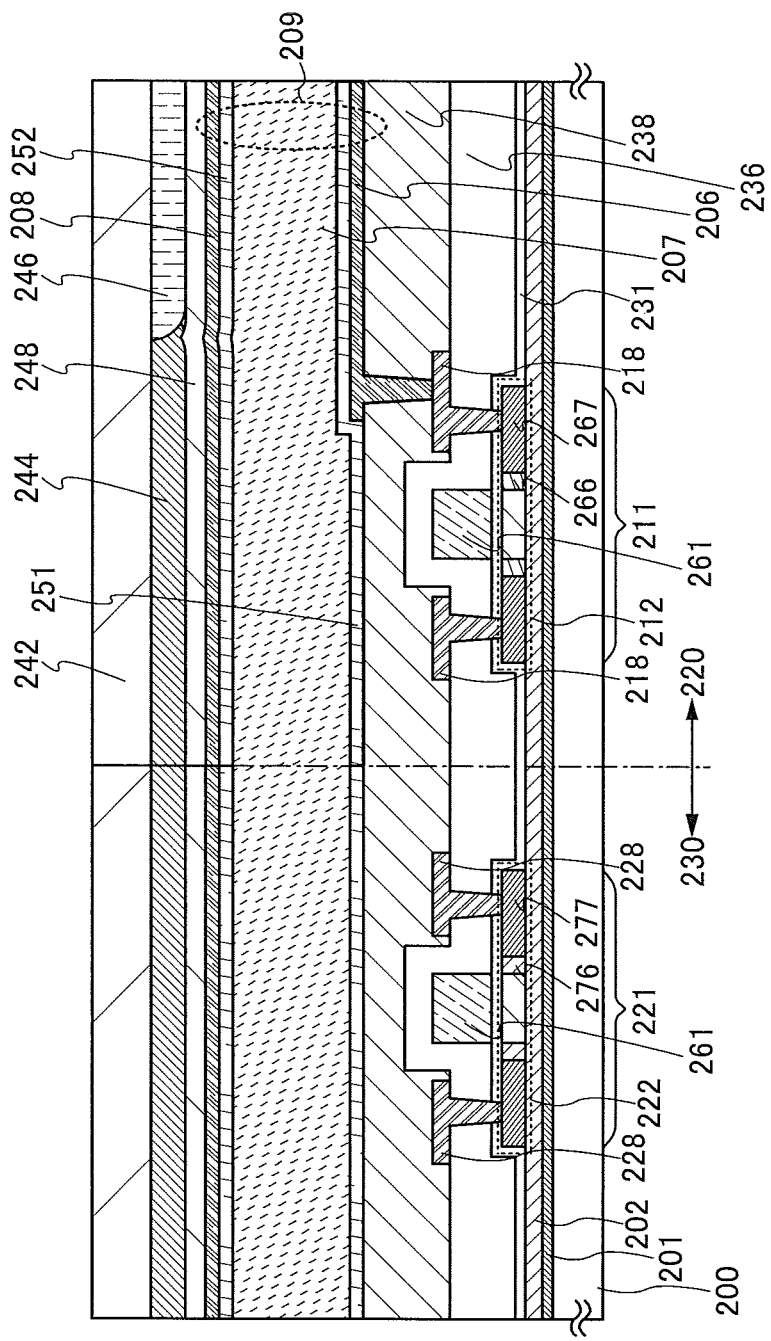
FIG. 5 is a cross-sectional view illustrating one embodiment of a semiconductor device.

Furthermore, impurity regions 266 and impurity regions 276 in FIG. 5 are low-concentration impurity regions and serve as LDD regions of transistors. Impurity regions 267 and impurity regions 277 in FIG. 5 are high-concentration impurity regions and serve as source regions and drain regions of the transistors. The low-concentration impurity regions 266 and 276 and the high-concentration impurity regions 267 and 277 are formed using a resist mask in a manner similar to that of the low-concentration impurity regions 216 and the high-concentration impurity regions 217, which is illustrated in FIGS. 4A and 4B.

The transistors each including the gate electrode having a single-layer structure can be manufactured by a simple process, whereby cost reduction can be achieved.

Embodiment 2

In this embodiment, a structure of a semiconductor device different from that of the semiconductor device of Embodiment 1 is described with reference to the drawings.

Figure 6:
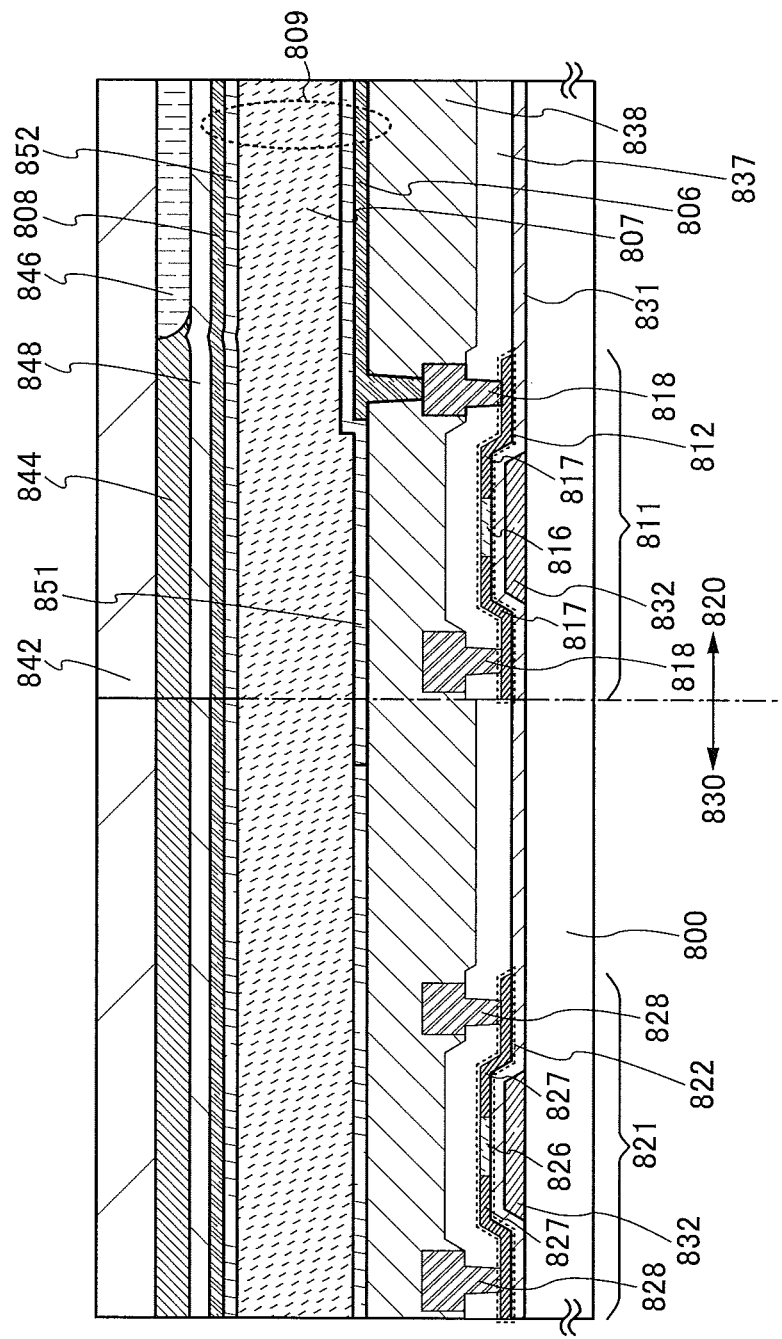
FIG. 6 is a cross-sectional view illustrating one embodiment of a semiconductor device.

In FIG. 6, a transistor 811 is a transistor included in a pixel portion, and a transistor 821 is a transistor included in a driver circuit portion.

As illustrated in FIG. 6, a conductive layer 832 serving as a gate electrode is formed over a substrate 800. An insulating film 831 serving as a gate insulating film is formed so as to cover the conductive layer 832. A semiconductor layer 812 and a semiconductor layer 822 are formed over the insulating film 831. A channel region 816, a channel region 826, impurity regions 817, and impurity regions 827 are formed in the semiconductor layer 812 and the semiconductor layer 822. The impurity regions 817 and the impurity regions 827 serve as source regions and drain regions.

As the substrate 800, the substrate 200 described in Embodiment 1 can be used as appropriate.

The conductive layer 832 is formed with a single layer or stacked layers using an element selected from molybdenum (Mo), aluminum (Al), tantalum (Ta), tungsten (W), titanium (Ti), copper (Cu), chromium (Cr), niobium (Nb), neodymium, scandium, nickel, and the like, or an alloy material or a chemical compound material containing any of the above elements as its main component (for example, tantalum nitride). Alternatively, the conductive layer 832 is formed using a semiconductor material typified by polycrystalline silicon doped with an impurity element such as phosphorus.

The following are preferable examples of the two-layer structure of the conductive layer 832: a two-layer structure in which a molybdenum film is provided over an aluminum film, a two-layer structure in which a molybdenum film is provided over a copper film, a two-layer structure in which a titanium nitride film or a tantalum nitride film is provided over a copper film, a two-layer structure in which a titanium nitride film and a molybdenum film are stacked, a two-layer structure in which a film of a copper-magnesium alloy containing oxygen and a copper film are stacked, a two-layer structure in which a film of a copper-manganese alloy containing oxygen and a copper film are stacked, a two-layer structure in which a copper-manganese alloy film and a copper film are stacked, or the like. As a three-layer structure, it is preferable to stack a tungsten film or a tungsten nitride film, an alloy film of aluminum and silicon or an alloy film of aluminum and titanium, and a titanium nitride film or a titanium film. By stacking a metal film functioning as a barrier film over a film having low electric resistance, electric resistance can be low and diffusion of a metal element from the metal film into a semiconductor film can be prevented.

Through the step of forming the conductive layer 832, a gate wiring (a scan line) and a capacitor wiring can also be formed at the same time. The scan line means a wiring for selecting a pixel, while the capacitor wiring means a wiring which is connected to one of electrodes of a storage capacitor in a pixel. However, one embodiment of the present invention is not limited thereto, and either one or both of the gate wiring and the capacitor wiring may be formed by a separate step from that of the conductive layer 832.

The insulating film 831 can be formed by a CVD method, a sputtering method, or the like.

Further, by the formation of a silicon oxide film by a CVD method using an organosilane gas as the insulating film 831, the crystallinity of the semiconductor film to be formed later can be increased, whereby the on-state current and the field-effect mobility of the transistor can be increased. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

The semiconductor layer 812 and the semiconductor layer 822 are preferably formed using a crystalline silicon layer, but may be formed using an amorphous silicon layer. The crystalline silicon layer is formed in such a manner that, after an amorphous silicon film is formed, the amorphous silicon film is crystallized by laser irradiation. Alternatively, after a metal film such as a Ni film is formed over an amorphous silicon film, the amorphous silicon film may be thermally crystallized. Further alternatively, a crystalline silicon film may be formed by a CVD method. An impurity element can be introduced by an ion doping method, an ion implantation method, or the like with the use of an n-type impurity element or a p-type impurity element to form the impurity regions 817 and the impurity regions 827. As the n-type impurity element, phosphorus (P), arsenic (As), or the like can be used. As the p-type impurity element, boron (B), aluminum (Al), gallium (Ga), or the like can be used. Here, ion doping is performed using phosphorus (P) to form the n-channel transistors 811 and 821.

Conductive layers 818 and conductive layers 828 are source electrodes and drain electrodes. Each of the conductive layers 818 and the conductive layers 828 can be formed with a single layer structure or a stacked-layer structure using an element selected from aluminum, tungsten, titanium, tantalum, molybdenum, nickel, and neodymium, or an alloy containing a plurality of any of these elements. For example, a conductive layer that is formed using an alloy that contains a plurality of any of the elements given above can be formed from an aluminum alloy that contains titanium, an aluminum alloy that contains neodymium, or the like can be used. In the case of forming a stacked-layer structure, for example, a structure where an aluminum layer or the above-described aluminum alloy layer is sandwiched between titanium layers can be used. Alternatively, crystalline silicon to which an impurity element which serves as a donor is added may be used. Further, a stacked-layer structure in which a film on the side that is in contact with the crystalline silicon to which an impurity element serving as a donor is added is formed using titanium, tantalum, molybdenum, tungsten, or a nitride of any of these elements, and a layer of aluminum or an aluminum alloy is formed thereover may be formed. Alternatively, the conductive film may have a stacked-layer structure where aluminum or an aluminum alloy is sandwiched with titanium, tantalum, molybdenum, tungsten, or nitride of any of these elements, on an upper side and a lower side thereof. The conductive layers 818 and the conductive layers 828 are formed by a CVD method, a sputtering method, or a vacuum evaporation method. Note that one of the conductive layer 818 and the conductive layer 828 serves as a signal line as well as a source electrode or a drain electrode. However, one embodiment of the present invention is not limited thereto, and a signal line may be provided separately from the source and drain electrodes.

An insulating film 837 and an insulating film 838 are interlayer insulating films. A conductive layer 806 is a pixel electrode. The conductive layer 806 serves as an anode or a cathode in a light-emitting device. Here, an example is described in which the conductive layer 806 is formed over the insulating film 838 provided over the conductive layer 818, but one embodiment of the present invention is not limited thereto. For example, the conductive layer 806 may be provided over the insulating film 837.

As the insulating film 837 and the insulating film 838, insulating films of silicon oxide, silicon oxynitride, silicon nitride, or the like which are formed by a CVD method, a sputtering method, or the like can be used. Alternatively, an organic resin such as an acrylic resin, a polyimide resin, a benzocyclobutene-based resin, a siloxane-based resin, a polyamide resin, or an epoxy resin can be used.

As the conductive layer 806, a transparent conductive film composed of a light-transmitting conductive material may be used, and indium oxide containing tungsten oxide, indium zinc oxide containing tungsten oxide, indium oxide containing titanium oxide, indium tin oxide containing titanium oxide, and the like can be used. Needless to say, it is possible to use indium tin oxide, indium zinc oxide, indium tin oxide with silicon oxide added, or the like. Furthermore, a material that has a high work function, for example, an element selected from nickel (Ni), tungsten (W), chromium (Cr), platinum (Pt), zinc (Zn), tin (Sn), indium (In), or molybdenum (Mo), or an alloy material including any of the metal elements as its main component, for example, titanium nitride, titanium silicon nitride, tungsten silicide, tungsten nitride, tungsten silicide nitride, or niobium nitride may be used to form a single layer film or a film of stacked layers.

Reference numeral 851 denotes an alignment film. The alignment film 851 can be formed using an organic resin such as polyimide. The thickness of the alignment film 851 is greater than or equal to 40 nm and less than or equal to 100 nm, preferably greater than or equal to 50 nm and less than or equal to 90 nm. With such a thickness, the pretilt angle of a liquid crystal material can be made large, which can reduce disclination.

A film having a coloring property (hereinafter referred to as a coloring film 846) is formed on the substrate 842. The coloring film 846 functions as a color filter. Further, a light-blocking film 844 adjacent to the coloring film 846 is formed on the substrate 842. The light-blocking film 844 functions as a black matrix. The coloring film 846 is not necessarily provided in the case where the liquid crystal display device is a monochrome display device, for example.

The coloring film 846 is a coloring film that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used.

The light-blocking film 844 preferably has a function of blocking light in a particular wavelength range, and can be a metal film or an organic insulating film including a black pigment.

An insulating film 848 is formed on the coloring film 846. The insulating film 848 functions as a planarization film or suppresses diffusion of impurities in the coloring film 846 to the liquid crystal element side.

A conductive layer 808 is formed on the insulating film 848. The conductive layer 808 functions as the other of the pair of electrodes of the liquid crystal element in the pixel portion. Note that the alignment film 851 is formed over the conductive layer 806 and an alignment film 852 is formed on the conductive layer 808.

A liquid crystal layer 807 is formed between the conductive layer 806 and the conductive layer 808. The liquid crystal layer 807 is sealed between the substrate 800 and the substrate 842 with the use of a sealant (not illustrated). The sealant is preferably in contact with an inorganic material to prevent entry of moisture and the like from the outside.

A spacer may be provided between the conductive layer 806 and the conductive layer 808 to maintain the thickness of the liquid crystal layer 807 (also referred to as a cell gap).

Note that the structure and the like described in this embodiment can be used as appropriate in combination with any of the structures and the like in the other embodiments.

Embodiment 3

In this embodiment, the driver circuit portion of the display device described in the above embodiments will be described.

Figure 9:
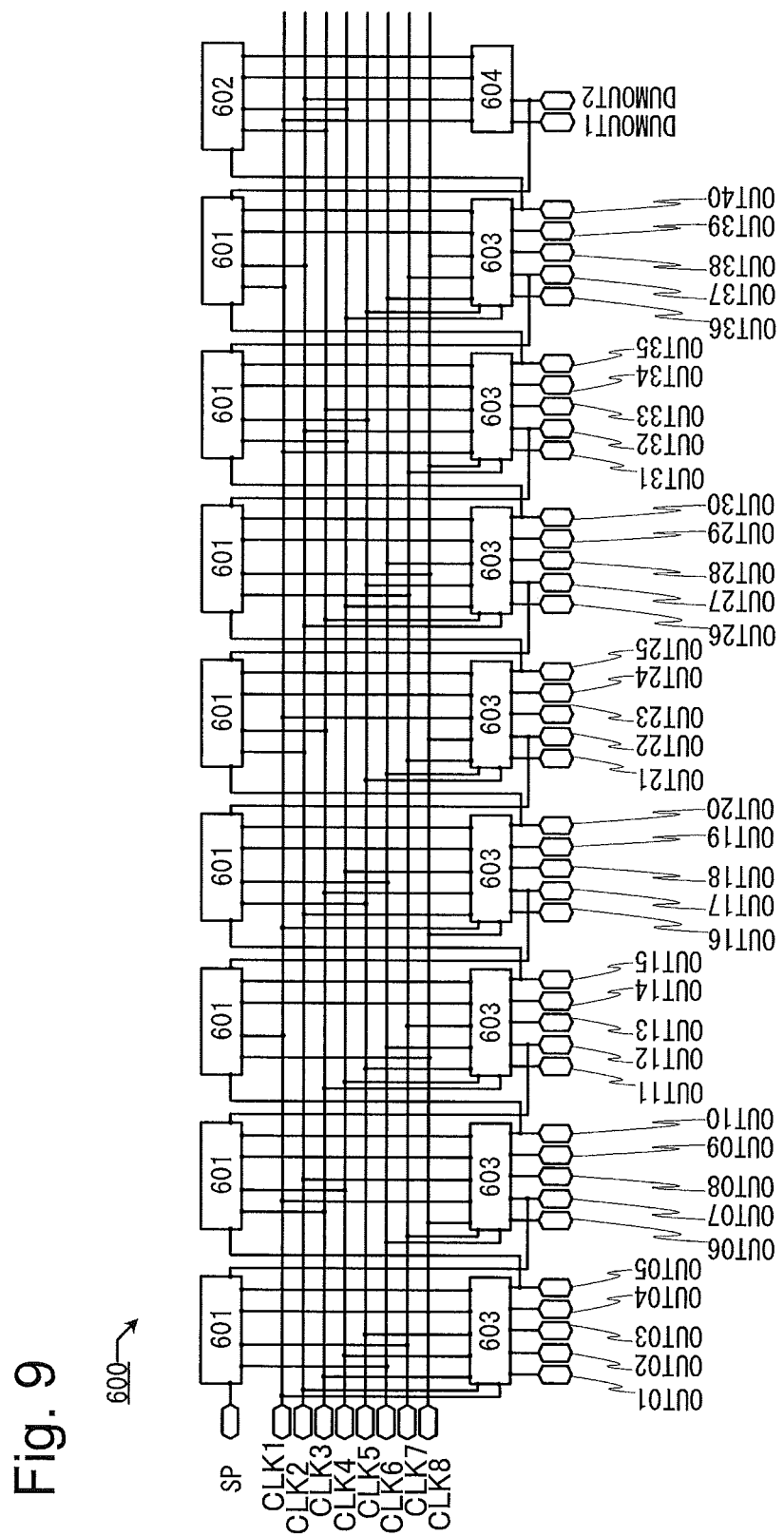
FIG. 9 illustrates an overall view of a gate driver circuit.

FIG. 9 is a diagram of an entire gate driver circuit as one example of a driver circuit of a display device. A gate driver circuit 600 includes a plurality of shift register units 601, a shift register unit 602 which is a dummy stage, demultiplexer circuits 603 electrically connected to the shift register units 601, a demultiplexer circuit 604 electrically connected to the shift register unit 602, and signal lines transmitting a start pulse SP and clock signals (CLK1 to CLK8).

Figure 10A:
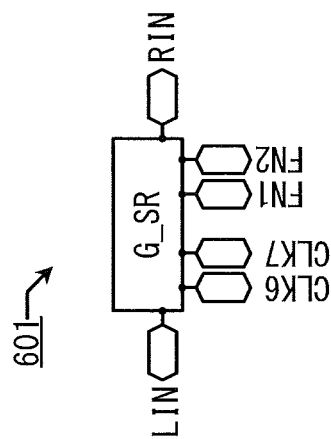
FIGS. 10A and 10B illustrate a shift register unit.
Figure 10B:
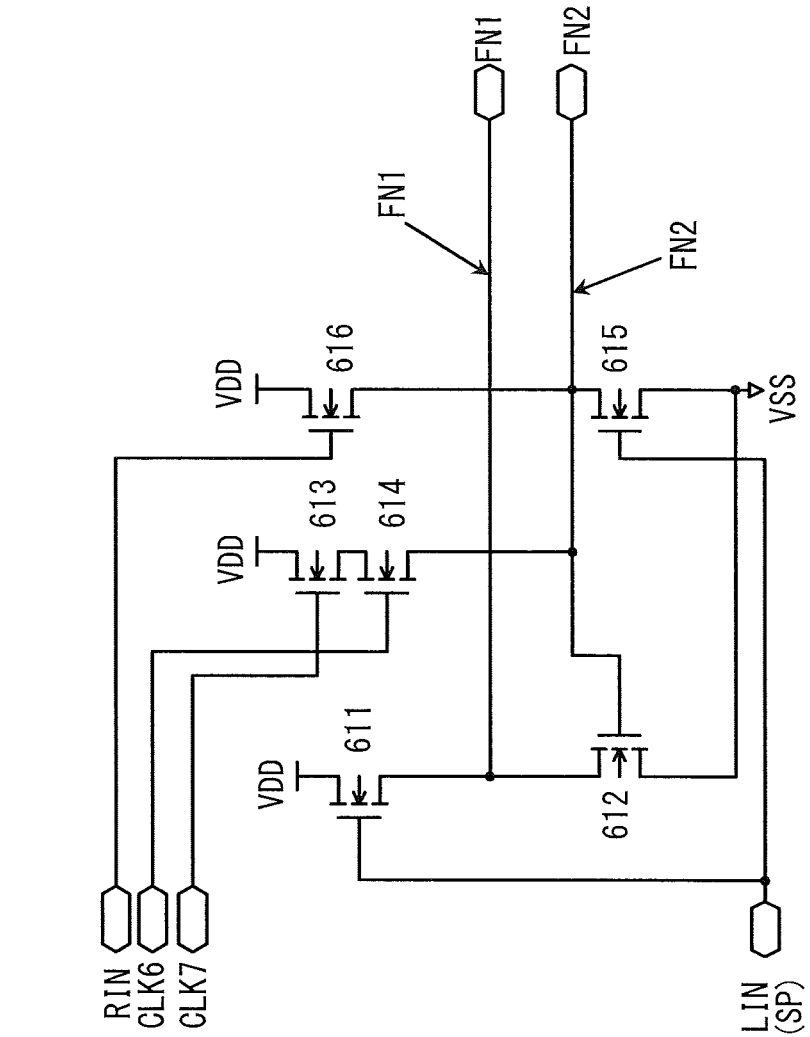

To the shift register unit 601 (here, description is made by using a shift register unit in the first stage), as shown in FIG. 10A, a set signal LIN (here, the start pulse SP), a reset signal RIN, and clock signals (here, CLK6 and CLK7) are input. FIG. 10B illustrates a specific circuit structure example. The shift register unit 601 includes a first transistor 611 to a sixth transistor 616.

One of a source and a drain of the first transistor 611 is connected to a high power supply potential line VDD. The other of the source and the drain of the first transistor 611 is connected to one of a source and a drain of the second transistor 612 and an input terminal FN1 of the demultiplexer circuit 603. The set signal LIN is input to a gate of the first transistor 611. The other of the source and the drain of the second transistor 612 is connected to a low power supply potential line VSS. A gate of the second transistor 612 is connected to an input terminal FN2 of the demultiplexer circuit 603, one of a source and a drain of the fourth transistor 614, one of a source and a drain of the fifth transistor 615, and one of a source and a drain of the sixth transistor 616. One of a source and a drain of the third transistor 613 is connected to the high power supply potential line VDD. The other of the source and the drain of the third transistor 613 is connected to the other of the source and the drain of the fourth transistor 614. The clock signal CLK7 is input to a gate of the third transistor 613. The clock signal CLK6 is input to a gate of the fourth transistor 614. The other of the source and the drain of the fifth transistor 615 is connected to the low power supply potential line VSS. The set signal LIN is input to a gate of the fifth transistor 615. The other of the source and the drain of the sixth transistor 616 is connected to the high power supply potential line VDD. The reset signal MN is input to a gate of the sixth transistor 616. Note that a portion in which the other of the source and the drain of the first transistor 611 and the one of the source and the drain of the second transistor 612 are electrically connected is referred to as a node FN1. A portion in which the gate of the second transistor 612, the one of the source and the drain of the fourth transistor 614, the one of the source and the drain of the fifth transistor 615, and the one of the source and the drain of the sixth transistor 616 are electrically connected is referred to as a node FN2.

The clock signals CLK6 and CLK7 are input to the shift register unit 601 in the (8a+1)th stage (a is zero or a natural number). The clock signals CLK3 and CLK4 are input to the shift register unit 601 in the (8a+2)th stage (a is zero or a natural number). The clock signals CLK1 and CLK8 are input to the shift register unit 601 in the (8a+3)th stage (a is zero or a natural number). The clock signals CLK5 and CLK6 are input to the shift register unit 601 in the (8a+4)th stage (a is zero or a natural number). The clock signals CLK2 and CLK3 are input to the shift register unit 601 in the (8a+5)th stage (a is zero or a natural number). The clock signals CLK7 and CLK8 are input to the shift register unit 601 in the (8a+6)th stage (a is zero or a natural number). The clock signals CLK4 and CLK5 are input to the shift register unit 601 in the (8a+7)th stage (a is zero or a natural number). The clock signals CLK1 and CLK2 are input to the shift register unit 601 in the 8(a+1)th stage (a is zero or a natural number).

Figure 11B:
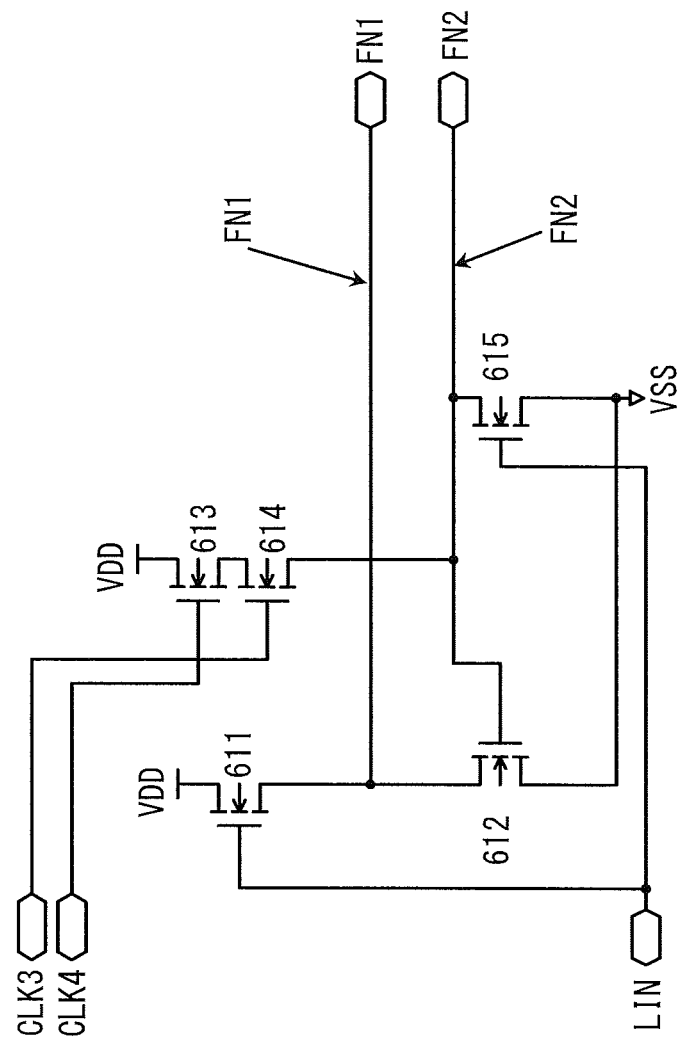
FIGS. 11A and 11B illustrate another shift register unit which is a dummy stage.
Figure 11A:
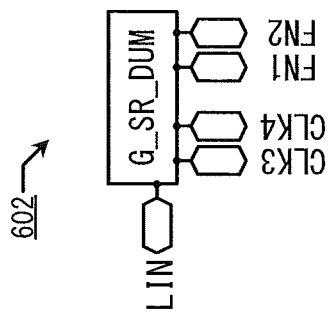

The set signal LIN and clock signals (here, CLK3 and CLK4) are input to the shift register unit 602 which is a dummy stage, as illustrated in FIG. 11A. FIG. 11B illustrates a specific circuit structure example. The shift register unit 602 includes the first transistor 611 to the fifth transistor 615.

The one of the source and the drain of the first transistor 611 is connected to the high power supply potential line VDD. The other of the source and the drain of the first transistor 611 is connected to the one of the source and the drain of the second transistor 612 and the input terminal FN1 of the demultiplexer circuit 604. The set signal LIN is input to the gate of the first transistor 611. The other of the source and the drain of the second transistor 612 is connected to the low power supply potential line VSS. The gate of the second transistor 612 is connected to the input terminal FN2 of the demultiplexer circuit 604, the one of the source and the drain of the fourth transistor 614, and the one of the source and the drain of the fifth transistor 615. The one of the source and the drain of the third transistor 613 is connected to the high power supply potential line VDD. The other of the source and the drain of the third transistor 613 is connected to the other of the source and the drain of the fourth transistor 614. The clock signal CLK4 is input to the gate of the third transistor 613. The clock signal CLK3 is input of the gate of the fourth transistor 614. The other of the source and the drain of the fifth transistor 615 is connected to the low power supply potential line VSS. The set signal LIN is input to the gate of the fifth transistor 615. Note that a portion in which the other of the source and the drain of the first transistor 611 and the one of the source and the drain of the second transistor 612 are electrically connected is referred to as the node FN1. A portion in which the gate of the second transistor 612, the one of the source and the drain of the fourth transistor 614, and the one of the source and the drain of the fifth transistor 615 are electrically connected is referred to as the node FN2.

Figure 12A:
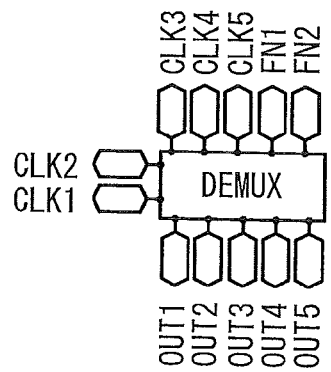
FIGS. 12A and 12B illustrate a demultiplexer.
Figure 12B:
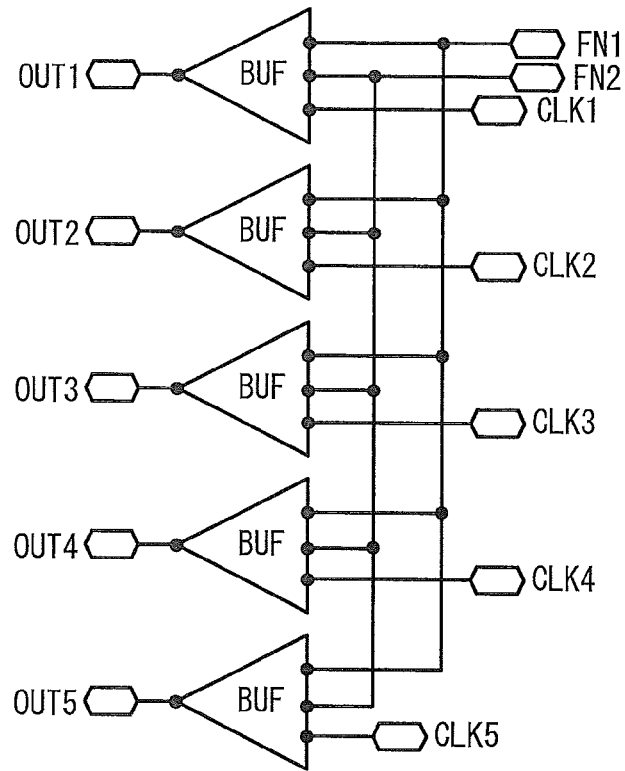
Figure 13A:
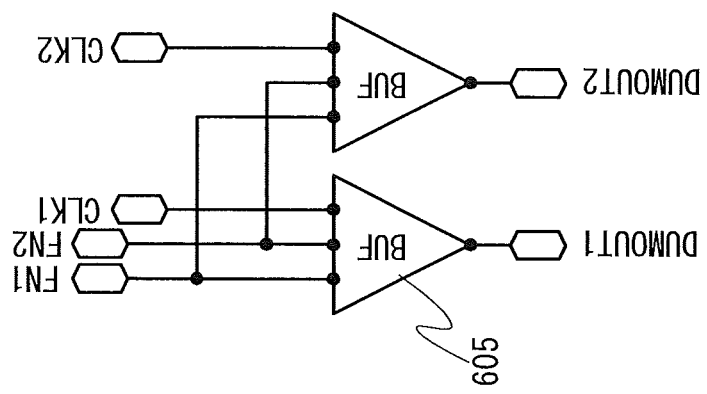
FIGS. 13A and 13B illustrate a demultiplexer.
Figure 13B:
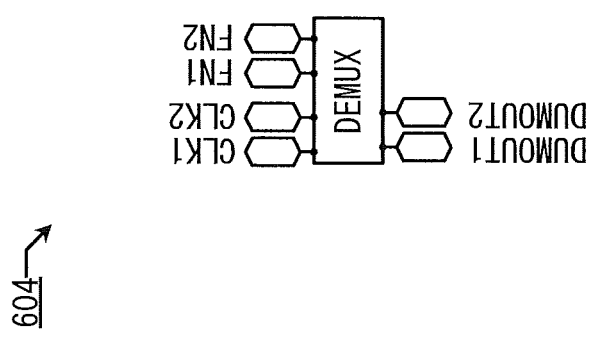

As illustrated in FIG. 12A and FIG. 13A, clock signals and output signals are input from the shift register unit 601 and the shift register unit 602 (signals input to the input terminal FN1 and the input terminal FN2) to the demultiplexer circuit 603 and the demultiplexer circuit 604, and the demultiplexer circuit 603 and the demultiplexer circuit 604 output output signals. FIG. 12B and FIG. 13B each illustrate a specific circuit structure example. The demultiplexer circuit 603 and the demultiplexer circuit 604 each include a buffer 605.

Figure 14:
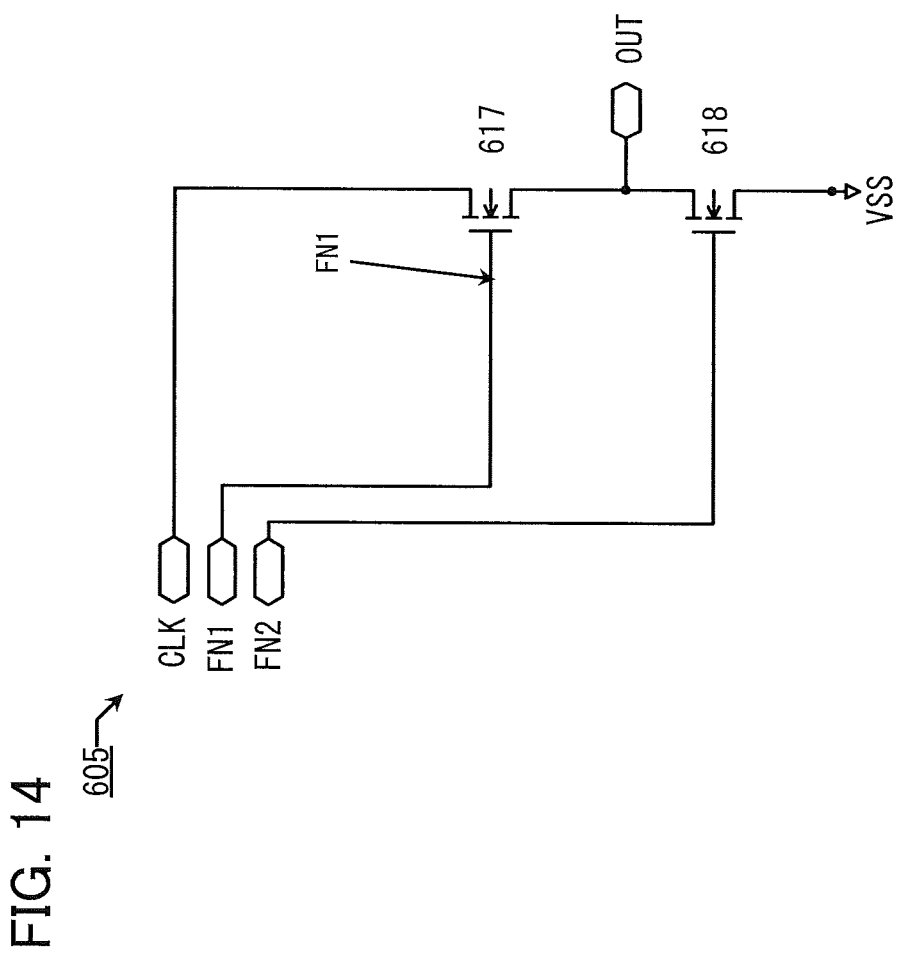
FIG. 14 illustrates a buffer.

FIG. 14 illustrates one example of a specific circuit structure of the buffer 605. A clock signal CLK (one of the clock signals CLK1 to CLK8) is input to one of a source and a drain of a seventh transistor 617. The other of the source and the drain of the seventh transistor 617 is connected to one of a source and a drain of an eighth transistor 618 and an output terminal. A gate of the seventh transistor 617 is connected to the node FN1. The other of the source and the drain of the eighth transistor 618 is connected to the low power supply potential line VSS. A gate of the eighth transistor 618 is connected to the node FN2.

Figure 15B:
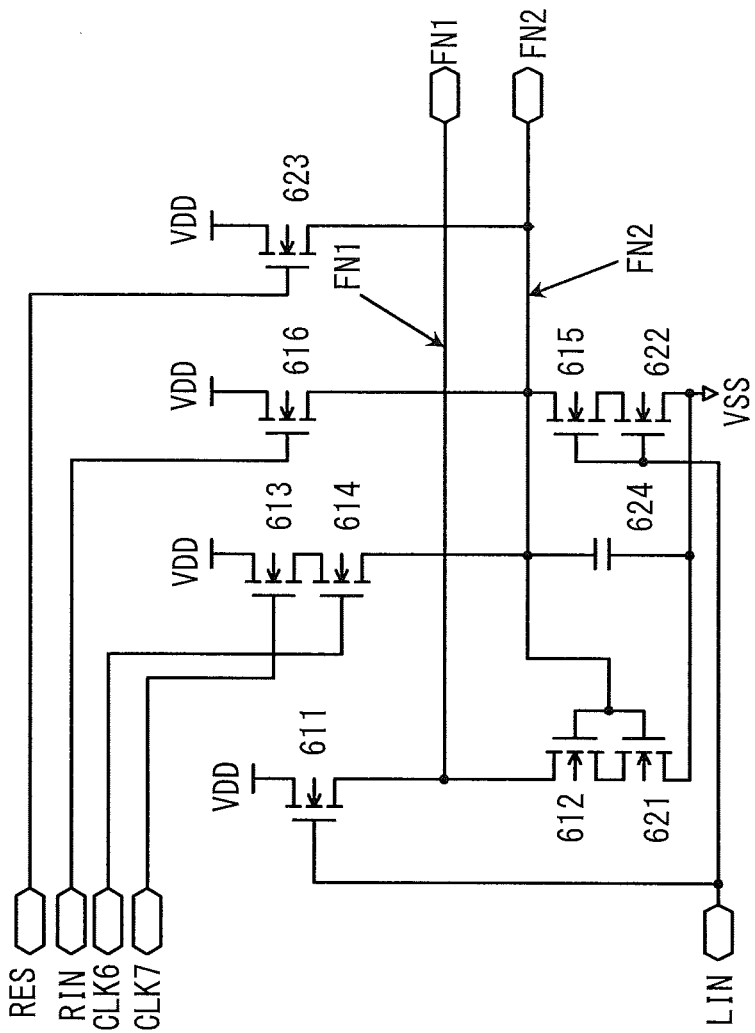
FIGS. 15A and 15B illustrate another shift register unit.
Figure 15A:
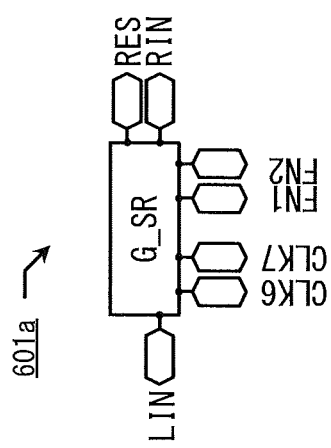

A shift register unit may be a shift register unit 601a which is illustrated in FIG. 15A and FIG. 15B and in which a transistor 621, a transistor 622, a transistor 623, and a capacitor 624 are added to the shift register unit 601. Note that a reset signal RES is input to a gate of the transistor 623.

Figure 16B:
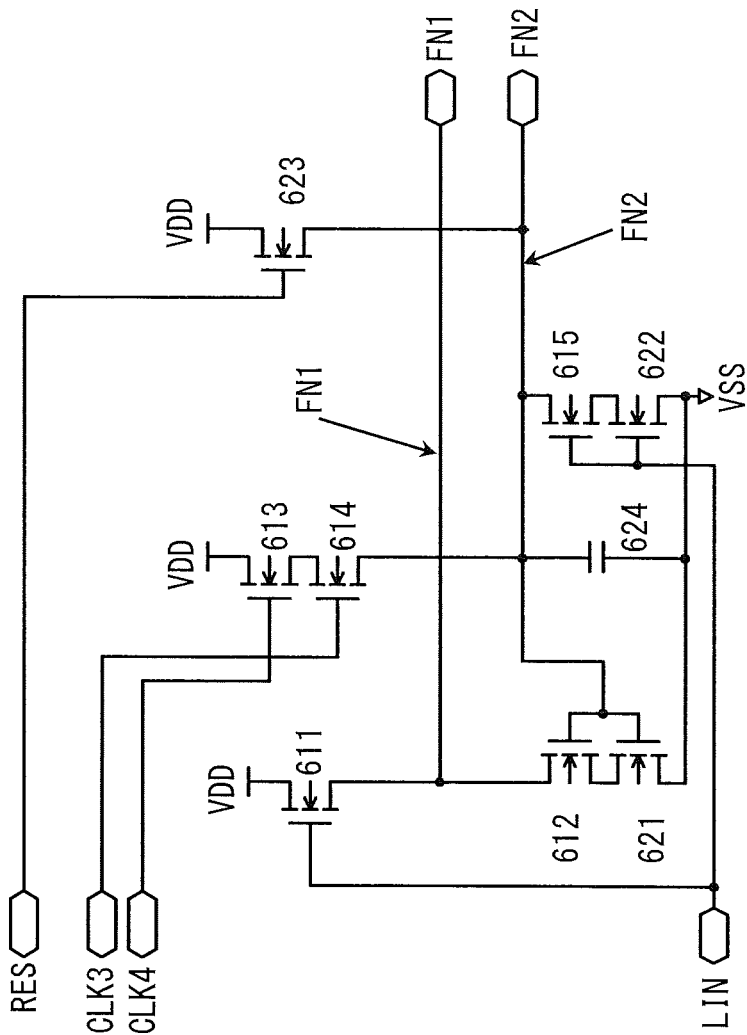
FIGS. 16A and 16B illustrate another shift register unit which is a dummy stage.
Figure 16A:
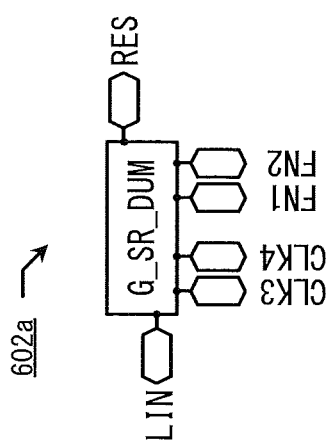

Similarly, a shift register unit which is a dummy stage may be a shift register unit 602a which is illustrated in FIG. 16A and FIG. 16B and in which the transistor 621, the transistor 622, the transistor 623, and the capacitor 624 are added to the shift register unit 602. Note that the reset signal RES is input to the gate of the transistor 623.

To initialize the shift register unit, a pulse of the reset signal RES is input to turn on the transistor 623, so that the potential of the node FN2 becomes equal to the potential of the high power supply potential line VDD. The second transistor 612 and the transistor 621 are turned on with the potential of the node FN2, so that the potential of the node FN1 becomes equal to the potential of the low power supply potential line VSS. Consequently, the shift register unit can be initialized. Note that the reset signal RES is input to all of the shift register units using a common signal line.

Figure 17A:
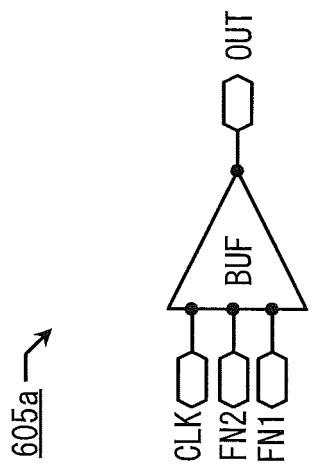
FIGS. 17A and 17B illustrate another buffer.
Figure 17B:
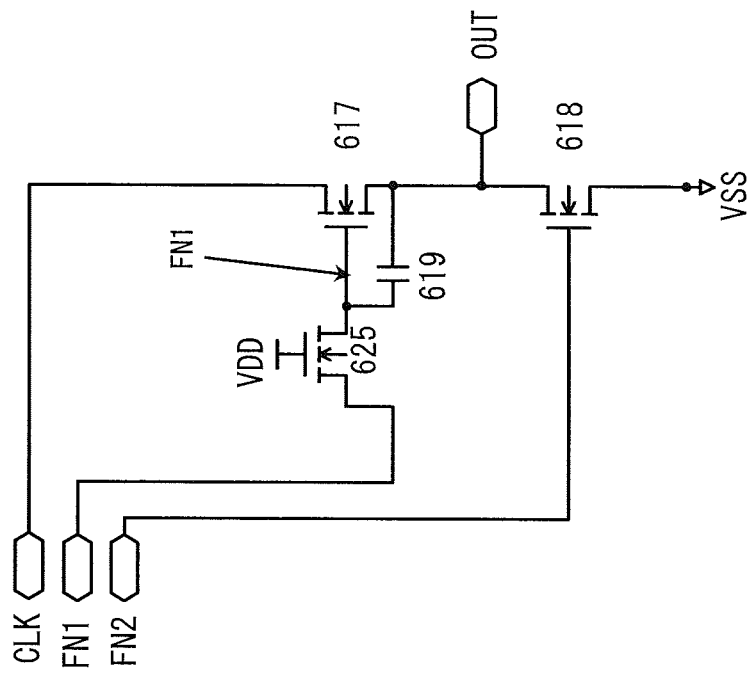

As illustrated in FIG. 17A and FIG. 17B, the buffer 605 can be replaced with a buffer 605a further provided with a transistor 625 and a capacitor 619.

The capacitor serves as storage capacitor for holding charge.

In the shift register unit 601 in the first stage, the clock signals CLK1 to CLK5 are input to the demultiplexer circuit 603 and the demultiplexer circuit 603 outputs output signals OUT1 to OUT5.

The potential of the node FN2 is fixed to a high potential in a period in which a gate selection output is not output, so that the second transistor 612 and the eighth transistor 618 are always on. In this way, the output is a low potential stably. However, in the case where the cutoff current (a drain current flowing at a gate voltage of 0 V) of the fifth transistor 615 is high, charge of the node FN2 leaks through the fifth transistor 615; therefore, charge needs to be regularly compensated. Thus, the third transistor 613 and the fourth transistor 614 are turned on with the clock signals CLK6 and CLK7, so that charge for the node FN2 is supplied from the high power supply potential line VDD. Note that a gate selection output period (the period in which the node FN1 is at high potential) of the shift register unit 601 in the first stage is a period from the rising (set) of the start pulse SP to the rising (reset) of the clock signal CLK7, which is described later. In the period, the gate selection output period and timing of regular compensation of charge are set not to overlap each other with two clock signals.

In the shift register unit 601 in the first stage, the clock signal CLK8 is not input to anywhere. The clock signal is also provided to avoid overlapping timing of regular compensation of charge.

Similarly, in the shift register unit 601 in the second stage, the clock signals CLK1, CLK2, and CLK6 to CLK8 are input to the demultiplexer circuit 603, and the demultiplexer circuit 603 outputs the output signals OUT1 to OUT5. The clock signals CLK3 and CLK4 have a function of regularly compensating charge. In the shift register unit 601 in the second stage, the clock signal CLK5 is not input to anywhere.

The same can be applied to the shift register units 601 in the third and the following stages. In other words, one stage of the shift register unit inputs five clock signals to the demultiplexer circuit 603, and the demultiplexer circuit 603 outputs five output signals. Other two clock signals have a function of regularly compensating charge and are input to the shift register unit 601. The other clock signal is not input to anywhere.

The same is also applied to the shift register unit 602 which is a dummy stage. The clock signals CLK1 and CLK2 are input to the demultiplexer circuit 604, and the demultiplexer circuit 604 outputs output signals DUMOUT1 and DUMOUT2. The clock signals CLK3 and CLK4 have a function of regularly compensating charge.

The number of clock signals are eight in this embodiment, but the present invention is not limited thereto. The number of clock signals may be any number as long as it is four or more. For example, when the number of clock signals is n, the number of output signals is (n−3) since three clock signals do not contribute to output signals.

In other words, by connecting n signal lines for transmitting clock signals to one stage of the shift register unit, (n−3) output signals can be output. The larger n becomes, the smaller the rate of signal lines for transmitting clock signals which do not contribute to output becomes; accordingly, the area of the shift register unit part is small compared to a conventional structure in which one stage of a shift register unit outputs one output signal. Therefore, the width of the gate driver circuit 600 can be reduced.

Figures 18A, 18B:
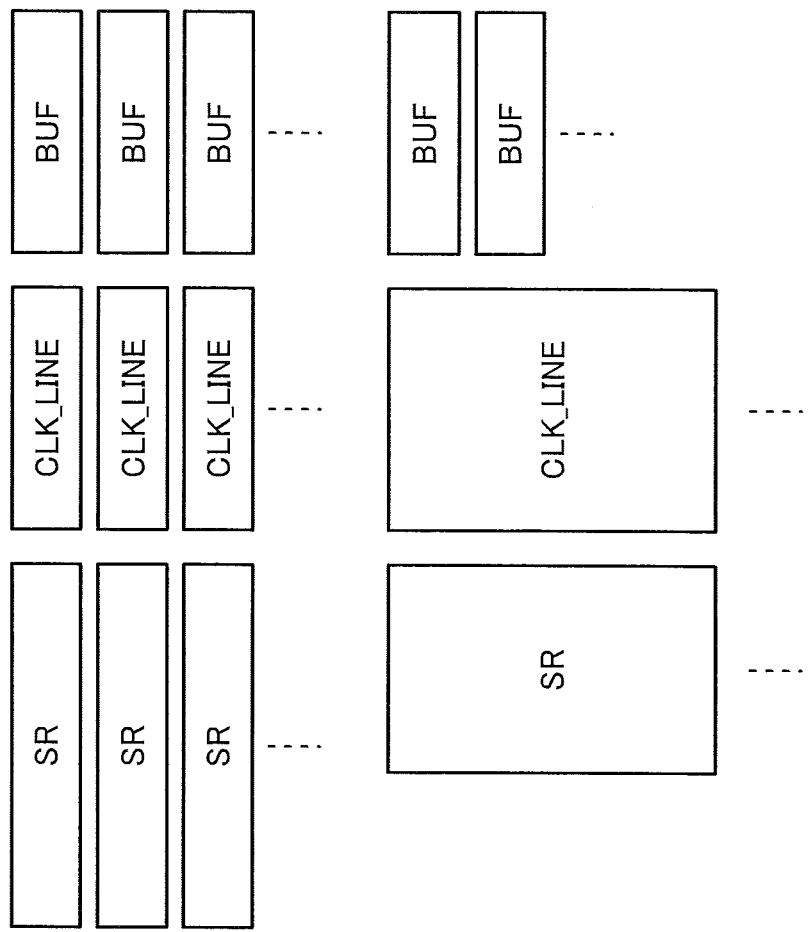
FIGS. 18A and 18B illustrate a way to obtain a narrower bezel.

Here, to narrow the width of the gate driver circuit 600 is briefly described. FIG. 18A is a block diagram of a conventional gate driver circuit. FIG. 18B is a block diagram of a gate driver circuit in this embodiment.

In a conventional gate driver circuit illustrated in FIG. 18A, one stage of a shift register unit SR is connected to four signal lines CLK_LINE for transmitting a clock signal and one buffer BUF outputs one signal. On the other hand, in the gate driver circuit in this embodiment illustrated in FIG. 18B, one shift register unit SR is connected to eight signal lines CLK_LINE for transmitting clock signals and five buffers BUF output five signals.

The gate driver circuit in this embodiment can have a smaller horizontal layout width of one shift register unit than that of the conventional gate driver circuit. The vertical layout width increases because of increased buffers BUF (here, five times as much as the conventional one), but the increase does not contribute to the bezel of the gate driver circuit. The horizontal layout width of one shift register unit can be reduced, so that the bezel can be narrower. In comparison with the conventional one, the number of the signal lines CLK_LINE for transmitting a clock signal is increased, and accordingly, load capacitance for each signal line CLK_LINE can be reduced. Therefore, even when the signal line CLK_LINE is set to thin to increase load resistance, delay time is not changed (because time constant=load capacitance×load resistance). Accordingly, by making the width of the signal line thin to obtain the same time constant, increase in layout width can be prevented; therefore, even if the number of the signal lines CLK_LINE is increased, the width of the gate driver circuit can be reduced.

Next, the operation of the gate driver circuit 600 is described with reference to a timing diagram in FIG. 19. Here, high potentials of the set signal LIN, the reset signal RIN, and the clock signals CLK1 to CLK8 correspond to the potential of the high power supply potential line VDD, while low potentials of the set signal LIN, the reset signal RIN, and the clock signals CLK1 to CLK8 correspond to the potential of the low power supply potential line VSS.

Figure 19:
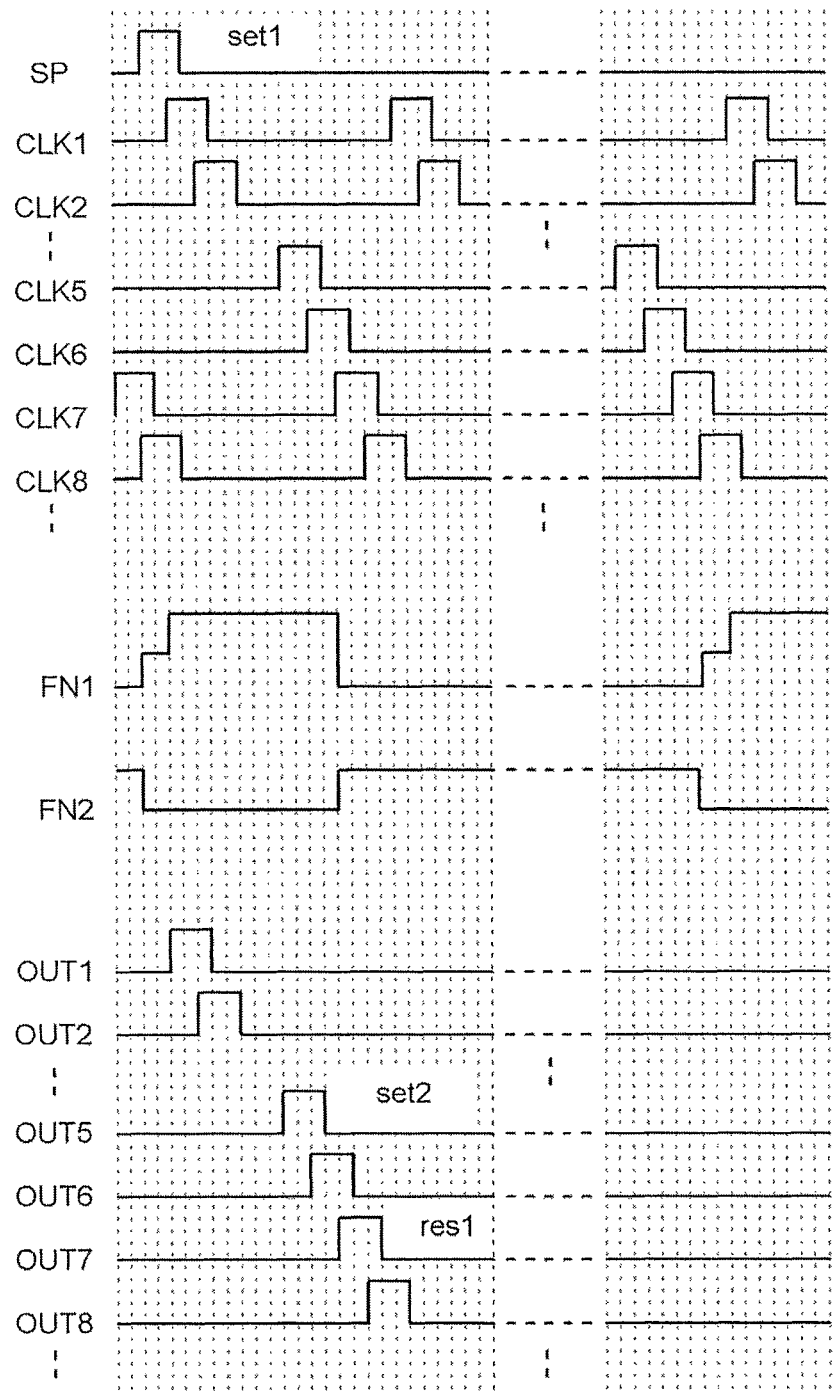
FIG. 19 is a timing diagram of a shift register unit.

In the driving method of the gate driver circuit 600 shown in FIG. 19, first, the start pulse SP is set to a high potential to turn on the first transistor 611 and the fifth transistor 615. Since the reset signal RIN (the output signal OUT7) is a low potential, the sixth transistor 616 is turned off. Since the clock signals CLK1 to CLK6 are low potentials and the clock signals CLK7 and CLK8 are high potentials, the fourth transistor 614 and the seventh transistor 617 are turned off and the third transistor 613 is turned on.

At that time, the potential of the node FN1 has a value obtained by subtracting the threshold voltage of the first transistor 611 from the potential of the high power supply potential line VDD (VDD−Vth(611)), while the potential of the node FN2 becomes equal to the potential of the low power supply potential line VSS. Accordingly, the seventh transistor 617 is turned on and the eighth transistor 618 is turned off, and thus, the output signals OUT1 to OUT5 are low potentials, as in the clock signals CLK1 to CLK5.

Then, the clock signal CLK7 is set to a low potential, so that the third transistor 613 is turned off. Note that a high potential is held at a node in which the other of the source and the drain of the third transistor 613 and the one of the source and the drain of the fourth transistor 614 are electrically connected.

Next, the clock signal CLK1 changes from a low potential to a high potential, and the potential of the node FN1 increases by a voltage corresponding to the amplitude of the clock signal CLK1 by a bootstrap operation. As a result, the seventh transistor 617 is turned on, and a high potential (the potential of the clock signal CLK1) is output as the output signal OUT1. Note that the bootstrap operation occurs similarly when the clock signals followed by the clock signal CLK2 changes from a low potential to a high potential. Next, the clock signal CLK8 becomes a low potential, but change does not occur because a signal of the clock signal CLK8 is not used for the shift register unit 601 in the first stage. Then, the clock signal CLK2 becomes a high potential, and a high potential is output as the output signal OUT2. After that, the clock signal CLK1 becomes a low potential, and a low potential is output as the output signal OUT1. The same can be applied to the following operation associated with the output signals OUT3 and OUT4. When the clock signal CLK5 becomes a high potential and the output signal OUT5 becomes a high potential, the set signal LIN of the shift register unit 601 in the second stage becomes a high potential.

In the shift register unit 601 in the first stage, when the clock signal CLK6 becomes a high potential, the fourth transistor 614 is turned on. Then, the clock signal CLK5 becomes a low potential, and a low potential is output as the output signal OUT5.

In the shift register unit 601 in the second stage, the set signal LIN (the output signal OUT5) becomes a high potential, and the first transistor 611 and the fifth transistor 615 are turned on. Since the reset signal RIN (an output signal OUT12) is a low potential, the sixth transistor 616 is turned off. Since the clock signals CLK1, CLK2, and CLK6 to CLK8 become a low potential and the clock signals CLK4 and CLK5 become high potential, the fourth transistor 614 and the seventh transistor 617 are turned off and the third transistor 613 is turned on.

At this time, the potential of the node FN1 has a value obtained by subtracting the threshold voltage of the first transistor 611 from the potential of the high power supply potential line VDD (VDD−Vth(611)), while the potential of the node FN2 becomes equal to the potential of the low power supply potential line VSS. Accordingly, the seventh transistor 617 is turned on and the eighth transistor 618 is turned off, and thus, output signals OUT6 to OUT10 become a low potential, as in the clock signals CLK1, CLK2, and CLK6 to CLK8.

Next, the clock signal CLK4 becomes a low potential, and the third transistor 613 is turned off. Note that a high potential is held at a node in which the other of the source and the drain of the third transistor 613 and the one of the source and the drain of the fourth transistor 614 are electrically connected.

Next, the clock signal CLK6 changes from a low potential to a high potential, and the potential of the node FN1 increases by a voltage corresponding to the amplitude of the clock signal CLK6 by a bootstrap operation. As a result, the seventh transistor 617 is turned on, and a high potential (the potential of the clock signal CLK6) is output as the output signal OUT6. Next, the clock signal CLK5 becomes a low potential, but change does not occur because a signal of the clock signal CLK5 is not used for the shift register unit 601 in the second stage. Then, the clock signal CLK7 becomes a high potential, and a high potential is output as the output signal OUT7.

At that time, in the shift register unit 601 in the first stage, the reset signal RIN (the output signal OUT7) becomes a high potential, and the sixth transistor 616 is turned on, so that the potential of the node FN2 becomes equal to the potential of the high power supply potential line VDD. The second transistor 612 is turned on with the potential of the node FN2, so that the potential of the node FN1 becomes the potential of the low power supply potential line VSS and then is reset.

The shift register unit 601 in the second stage is driven like the shift register unit 601 in the first stage.

That is, the output signal OUT5(*m*−1) of the shift register unit 601 in the (m−1)th stage is input as the set signal LIN of the shift register unit 601 in the m-th stage (m is a natural number). The output signal OUT5(*m*+2) of the shift register unit 601 in the (m+1)th stage is input as the reset signal RIN of the shift register unit 601 in the m-th stage. Note that the set signal LIN when in is 1 corresponds to the start pulse SP.

The shift register unit 602 which is a dummy stage is similar to the shift register unit 601. The reset signal RIN can be input to the shift register unit 601 in the final stage with the shift register unit 602.

Note that pulses of a clock signal and the next clock signal overlap by one third of the pulse width in this embodiment, but the present invention is not limited thereto. The overlap width may be any value as long as it is half of the pulse width or less. The falling of the pulse of the clock signal and the rising of the pulse of the next clock signal may be at the same timing. In that case, the gate selection output period of the shift register unit 601 in the first stage is a period from the rising (set) of the start pulse SP to the rising (reset) of the clock signal CLK6; accordingly, the number of clock signals needed for regularly compensating charge is only one.

Note that the structure and the like described in this embodiment can be used as appropriate in combination with any of the structures and the like in the other embodiments.

Embodiment 4

The semiconductor device of one embodiment of the present invention can be used in a sensor that can detect proximity or touch of an object (e.g., a capacitive, a resistive, a surface acoustic wave, an infrared, and an optical touch sensor) and a radiographic image detection device that can obtain a medical radiographic image. The semiconductor device which is one embodiment of the present invention can be applied to a variety of electronic appliances (including game machines). Examples of electronic appliances include a television device (also referred to as television or television receiver), a monitor of a computer or the like, a digital camera, a digital video camera, a digital photo frame, a mobile phone, a portable game machine, a portable information terminal, an audio reproducing device, a game machine (e.g., a pachinko machine or a slot machine), and a game console, and the like. Examples of these electronic appliances are illustrated in FIGS. 7A to 7C.

Figure 7A:
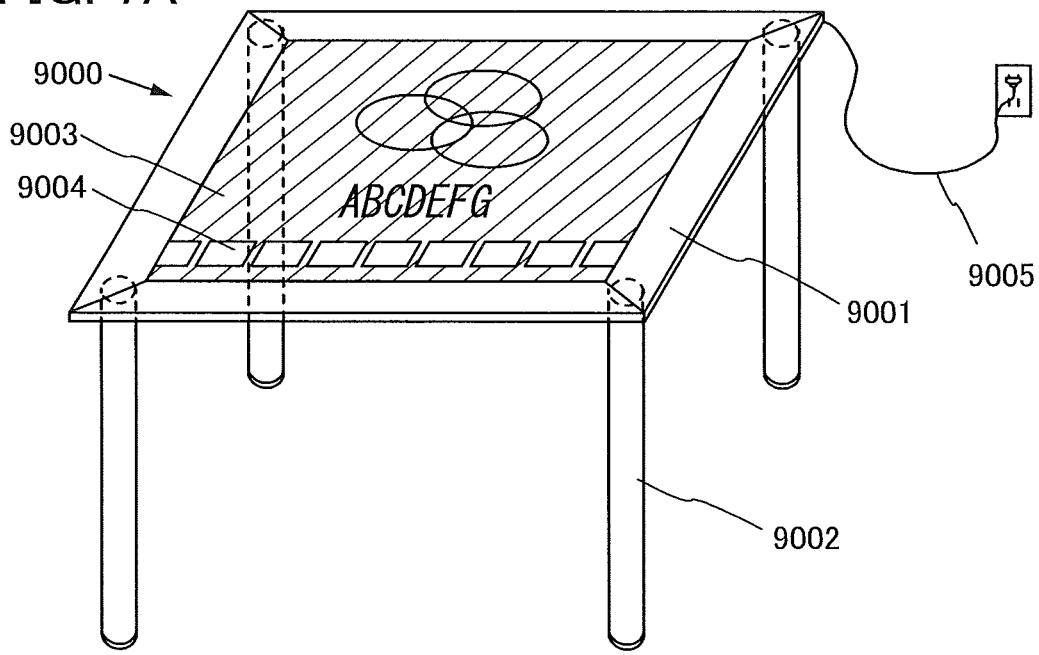
FIGS. 7A to 7C illustrate electronic devices each including a semiconductor device which is one embodiment of the present invention.
Figure 7B:
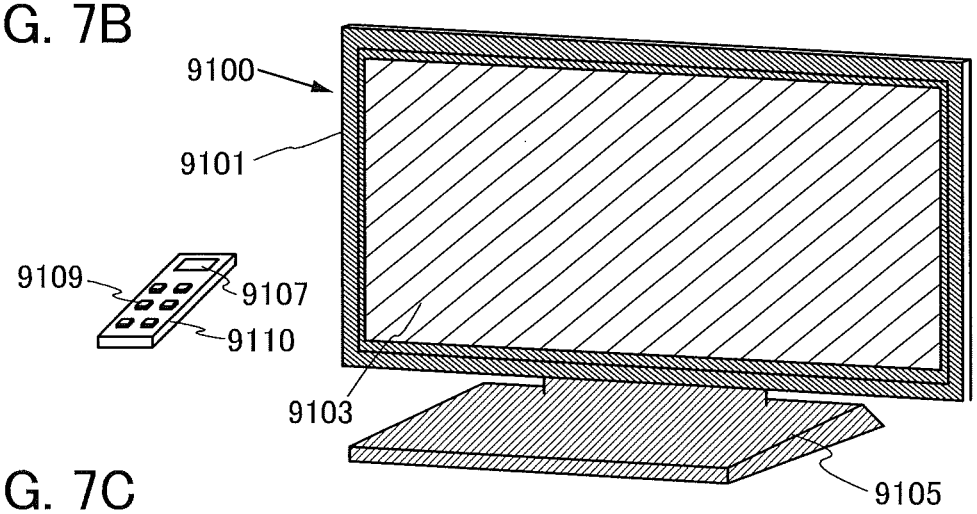
Figure 7C:
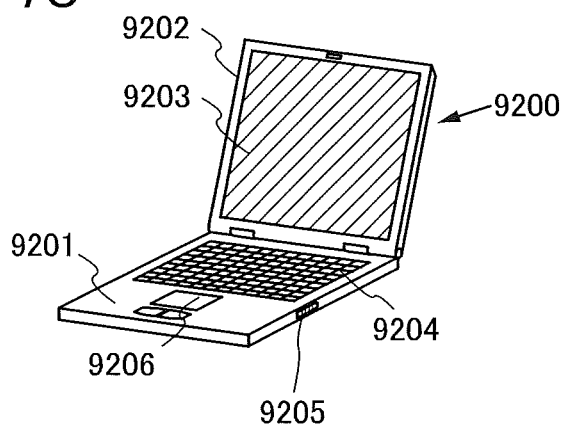

FIG. 7A illustrates a table 9000 having a display portion. In the table 9000, a display portion 9003 is incorporated in a housing 9001 and an image can be displayed on the display portion 9003. The housing 9001 is supported by four leg portions 9002. Further, a power cord 9005 for supplying power is provided for the housing 9001.

The semiconductor device described in any of the above embodiments can be used for the display portion 9003. Thus, the display portion 9003 can have high display quality.

The display portion 9003 has a touch-input function. When a user touches displayed buttons 9004 which are displayed on the display portion 9003 of the table 9000 with his/her fingers or the like, the user can carry out operation of the screen and input of information. Further, when the table may be made to communicate with home appliances or control the home appliances, the display portion 9003 may function as a control device which controls the home appliances by operation on the screen. For example, with use of a semiconductor device having an image sensor function, the display portion 9003 can have a touch-input function.

Further, the screen of the display portion 9003 can be placed perpendicular to a floor with a hinge provided for the housing 9001; thus, the table can also be used as a television device. When a television device having a large screen is set in a small room, an open space is reduced; however, when a display portion is incorporated in a table, a space in the room can be efficiently used.

FIG. 7B illustrates a television device 9100. In the television device 9100, a display portion 9103 is incorporated in a housing 9101 and an image can be displayed on the display portion 9103. Note that the housing 9101 is supported by a stand 9105 here.

The television device 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television device 9100 illustrated in FIG. 7B is provided with a receiver, a modem, and the like. With the receiver, general television broadcasts can be received in the television device 9100. Further, when the television device 9100 is connected to a communication network by wired or wireless connection via the modem, one-way (from a transmitter to a receiver) or two-way (between a transmitter and a receiver or between receivers) data communication can be performed.

Any of the semiconductor devices described in the above embodiments can be used for the display portions 9103 and 9107. Thus, the television device can have high display quality.

FIG. 7C illustrates a computer 9200, which includes a main body 9201, a housing 9202, a display portion 9203, a keyboard 9204, an external connection port 9205, a pointing device 9206, and the like.

Any of the semiconductor devices described in the above embodiments can be used for the display portion 9203. Thus, the computer 9200 can have high display quality.

Figure 8A:
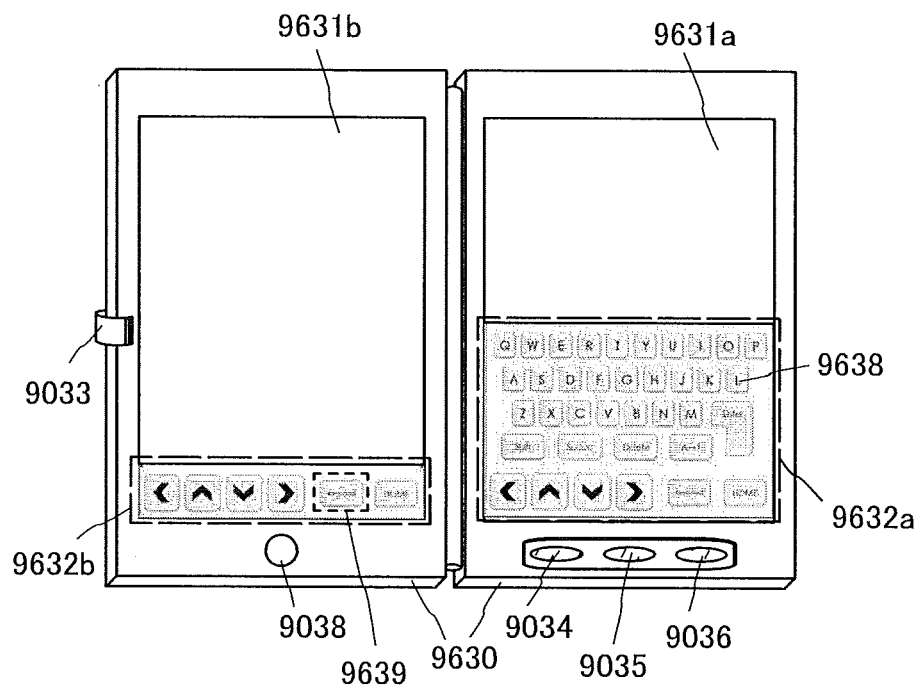
FIGS. 8A to 8C illustrate an electronic device including a semiconductor device which is one embodiment of the present invention.
Figure 8B:
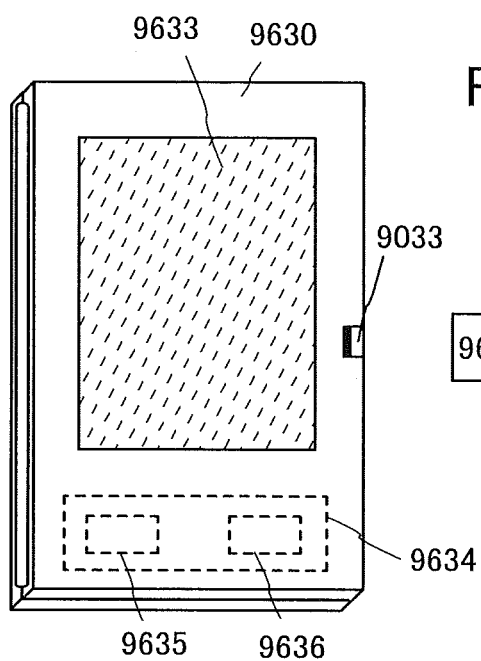

FIGS. 8A and 8B illustrate a foldable tablet terminal. The tablet terminal is opened in FIG. 8A. The tablet terminal includes a housing 9630, a display portion 9631a, a display portion 9631b, a display mode switch 9034, a power switch 9035, a power saver switch 9036, a clasp 9033, and an operation switch 9038.

The semiconductor device described in any of the above embodiments can be used for the display portion 9631a and the display portion 9631b. Thus, the display quality of the tablet terminal can be improved.

Part of the display portion 9631a can be a touch panel region 9632a and data can be input when a displayed operation key 9638 is touched. Although a structure in which a half region in the display portion 9631a has only a display function and the other half region also has a touch panel function is illustrated as an example, the structure of the display portion 9631a is not limited thereto. The whole area of the display portion 9631a may have a touch screen function. For example, the whole area of the display portion 9631a can display keyboard buttons and serve as a touch screen while the display portion 9631b can be used as a display screen.

Like the display portion 9631a, part of the display portion 9631b can be a touch screen region 9632b. When a keyboard display switching button 9639 displayed on the touch panel is touched with a finger, a stylus, or the like, a keyboard can be displayed on the display portion 9631b.

Touch input can be performed concurrently on the touch screen regions 9632a and 9632b.

The display-mode switching switch 9034 can switch display orientation (e.g., between landscape mode and portrait mode) and select a display mode (switch between monochrome display and color display), for example. The power-saving-mode switching switch 9036 can control display luminance in accordance with the amount of external light in use of the tablet terminal detected by an optical sensor incorporated in the tablet. The tablet terminal may include another detection device such as a sensor for detecting orientation (e.g., a gyroscope or an acceleration sensor) in addition to the optical sensor.

Although the display portion 9631a and the display portion 9631b have the same display area in FIG. 8A, one embodiment of the present invention is not limited to this example. The display portion 9631a and the display portion 9631b may have different areas or different display quality. For example, one of them may be a display panel that can display higher-definition images than the other.

In FIG. 8B, the tablet terminal is folded and includes the housing 9630, a solar cell 9633, and a charge and discharge control circuit 9634. Note that in FIG. 8B, an example in which the charge and discharge control circuit 9634 includes the battery 9635 and the DCDC converter 9636 is illustrated.

Since the tablet can be folded in two, the housing 9630 can be closed when not in use. Thus, the display portions 9631a and 9631b can be protected, thereby providing a tablet with high endurance and high reliability for long-term use.

In addition, the tablet terminal illustrated in FIGS. 8A and 8B can have a function of displaying various kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar cell 9633, which is attached on the surface of the tablet terminal, supplies electric power to a touch screen, a display portion, an image signal processor, and the like. Note that the solar cell 9633 can be provided on one or both surfaces of the housing 9630, so that the battery 9635 can be charged efficiently. The use of a lithium ion battery as the battery 9635 is advantageous in downsizing or the like.

Figure 8C:
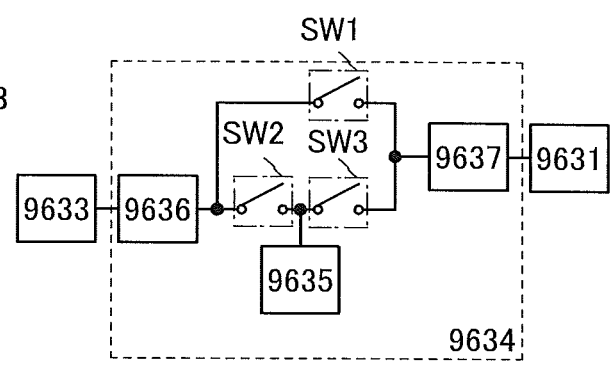

The structure and operation of the charge and discharge control circuit 9634 illustrated in FIG. 8B are described with reference to a block diagram of FIG. 8C. The solar cell 9633, the battery 9635, the DCDC converter 9636, a converter 9637, switches SW1 to SW3, and the display portion 9631 are shown in FIG. 8C, and the battery 9635, the DCDC converter 9636, the converter 9637, and the switches SW1 to SW3 correspond to the charge/discharge control circuit 9634 in FIG. 8B.

First, an example of the operation in the case where power is generated by the solar cell 9633 using external light is described. The voltage of power generated by the solar battery is raised or lowered by the DCDC converter 9636 so that the power has a voltage for charging the battery 9635. Then, when the power from the solar cell 9633 is used for the operation of the display portion 9631, the switch SW1 is turned on and the voltage of the power is raised or lowered by the converter 9637 so as to be a voltage needed for the display portion 9631. In addition, when display on the display portion 9631 is not performed, the switch SW1 is turned off and a switch SW2 is turned on so that charge of the battery 9635 may be performed.

Note that the solar cell 9633 is described as an example of a power generation means; however, without limitation thereon, the battery 9635 may be charged using another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

Note that the structures and the like described in this embodiment can be combined as appropriate with any of the structures and the like described in the other embodiments. This application is based on Japanese Patent Application serial No. 2013-144276 filed with Japan Patent Office on Jul. 10, 2013, the entire contents of which are hereby incorporated by reference.

What is claimed is:

1. A driver circuit comprising:
    m shift register units;
    m demultiplexer circuits electrically connected to the in shift register units; and
    n signal lines,
    wherein m is a natural number of three or more,
    wherein n is a natural number of four or more,
    wherein a semiconductor element including silicon is comprised in at least one of the m shift register units and the m demultiplexer circuits,
    wherein each of the m shift register units is electrically connected to one to (n−1) signal lines,
    wherein each of the m demultiplexer circuits is electrically connected to one to (n−3) signal lines,
    wherein one of outputs of (m−2)th demultiplexer circuit is input to (m−1)th shift register unit, and
    wherein one of outputs of m-th demultiplexer circuit is input to (m−1)th shift register unit.

2. The driver circuit according to claim 1, wherein the silicon is crystalline silicon.

3. A display device comprising the driver circuit according to claim 1.

4. An electronic device comprising the display device according to claim 3.

5. A driver circuit comprising:
    m shift register units, each shift register including:
        a set signal line;
        a first transistor;
        a second transistor;
        a third transistor;
        a fourth transistor;
        a fifth transistor; and
        a sixth transistor;
    m demultiplexer circuit; and
    n signal lines,
    wherein m is a natural number of three or more,
    wherein n is a natural number of four or more,
    wherein one of a source and a drain of the first transistor is electrically connected to a high power supply potential line,
    wherein the other of the source and the drain of the first transistor is electrically connected to one of a source and a drain of the second transistor and the demultiplexer circuit,
    wherein a gate of the first transistor is electrically connected to the set signal line,
    wherein the other of the source and the drain of the second transistor is electrically connected to a low power supply potential line,
    wherein a gate of the second transistor is electrically connected to the demultiplexer circuit, one of a source and a drain of the fourth transistor, one of a source and a drain of the fifth transistor, and one of a source and a drain of the sixth transistor,
    wherein one of a source and a drain of the third transistor is electrically connected to the high power supply potential line,
    wherein the other of the source and the drain of the third transistor is electrically connected to the other of the source and the drain of the fourth transistor,
    wherein a gate of the third transistor is electrically connected to one of the n signal lines,
    wherein a gate of the fourth transistor is electrically connected to one of the n signal lines,
    wherein the other of the source and the drain of the fifth transistor is electrically connected to the low power supply potential line,
    wherein a gate of the fifth transistor is electrically connected to the set signal line,
    wherein the other of the source and the drain of the sixth transistor is electrically connected to the high power supply potential line,
    wherein a gate of the sixth transistor is electrically connected to a reset signal line,
    wherein at least one of the first to the sixth transistors comprises a channel formation region including silicon,
    wherein the demultiplexer circuit includes a buffers,
    wherein a is a natural number of one to (n−3), wherein each of the a buffers is electrically connected to the other of the source and the drain of the first transistor and the gate of the second transistor,
    wherein each of the a buffers is electrically connected to corresponding one of the n signal lines,
    wherein each of the a buffers includes an output terminal,
    wherein one of the buffers of the a buffers of the (m−2)th demultiplexer circuit is electrically connected to the gates of the first transistor and the fifth transistor of the (m−1)th shift register unit, and wherein one of the buffers of the a buffers of the m-th demultiplexer circuit is electrically connected to the gates of the sixth transistor of the (m−1)th shift register unit.

6. The driver circuit according to claim 5,
wherein crystalline silicon is comprised in a channel formation region of at least one of the first to the sixth transistors.

7. A display device comprising the driver circuit according to claim 5.

8. An electronic device comprising the display device according to claim 7.

* * * * *

UNITED STATES PATENT AND TRADEMARK OFFICE
CERTIFICATE OF CORRECTION

PATENT NO. : 9,208,742 B2
APPLICATION NO. : 14/325603
DATED : December 8, 2015
INVENTOR(S) : Hiroyuki Miyake et al.

Page 1 of 1

It is certified that error appears in the above-identified patent and that said Letters Patent is hereby corrected as shown below:

In the Specification:

Column 2, Line 1; Change "the in demultiplexer" to --the m demultiplexer--.

Column 2, Line 3; Change "the in shift" to --the m shift--.

Column 2, Line 8; Change "the in shift" to --the m shift--.

Column 4, Line 4; Change "106, in scan" to --106, m scan--.

Column 9, Line 51; Change "90 mm." to --90 nm.--.

Column 17, Line 58; Change "signal MN is" to --signal RIN is--.

Column 22, Line 34; Change "when in is" to --when m is--.

In the Claims:

Column 25, Line 46, Claim 1; Change "to the in" to --to the m--.

Signed and Sealed this
Fifth Day of April, 2016

Michelle K. Lee
*Director of the United States Patent and Trademark Office*